(12) United States Patent
Surthi et al.

(10) Patent No.: US 11,871,572 B2
(45) Date of Patent: Jan. 9, 2024

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Lodestar Licensing Group LLC, Evanston, IL (US)

(72) Inventors: Shyam Surthi, Boise, ID (US); Davide Resnati, Vimercate (IT); Paolo Tessariol, Arcore (IT); Richard J. Hill, Boise, ID (US); John D. Hopkins, Meridian, ID (US)

(*) Notice: Subject to any disclaimer, the term of this patent is extended or adjusted under 35 U.S.C. 154(b) by 0 days.

(21) Appl. No.: 17/561,564

(22) Filed: Dec. 23, 2021

(65) Prior Publication Data

US 2022/0123018 A1 Apr. 21, 2022

Related U.S. Application Data

(62) Division of application No. 16/548,320, filed on Aug. 22, 2019, now Pat. No. 11,244,954.

(51) Int. Cl.
*H01L 27/11582* (2017.01)
*H01L 27/11556* (2017.01)
(Continued)

(52) U.S. Cl.
CPC .......... *H10B 43/27* (2023.02); *H01L 21/0214* (2013.01); *H01L 21/0217* (2013.01);
(Continued)

(58) Field of Classification Search
CPC ........... H01L 21/0214; H01L 21/02164; H01L 21/0217; H01L 21/02236
See application file for complete search history.

(56) References Cited

U.S. PATENT DOCUMENTS

2015/0294980 A1 10/2015 Lee
2016/0064532 A1 3/2016 Makala et al.
(Continued)

OTHER PUBLICATIONS

WO PCT/US2020/042432 IPRP, Feb. 17, 2022, Micron Technology, Inc.
(Continued)

*Primary Examiner* — Peniel M Gumedzoe
(74) *Attorney, Agent, or Firm* — Brooks, Cameron & Huebsch, PLLC

(57) ABSTRACT

Some embodiments include a NAND memory array having a vertical stack of alternating insulative levels and conductive levels. The conductive levels include control gate regions. High-k dielectric material is adjacent to the control gate regions and is configured as an arrangement of first vertically-extending linear segments which are vertically spaced from one another. Charge-blocking material is adjacent to the high-k dielectric material and is configured as an arrangement of second vertically-extending linear segments which are vertically spaced from one another. Charge-storage material is adjacent to the charge-blocking material and is configured as an arrangement of third vertically-extending linear segments which are vertically spaced from one another. Gate-dielectric material is adjacent to the charge-storage material. Channel material extends vertically along the stack and is adjacent to the gate-dielectric material. Some embodiments include integrated assemblies and methods of forming integrated assemblies.

23 Claims, 45 Drawing Sheets

(51) Int. Cl.
  *H01L 29/51*   (2006.01)
  *H01L 21/28*   (2006.01)
  *H01L 21/02*   (2006.01)
  *H01L 29/788*  (2006.01)
  *H01L 29/792*  (2006.01)
  *H10B 43/27*   (2023.01)
  *H01L 29/49*   (2006.01)
  *H10B 41/27*   (2023.01)

(52) U.S. Cl.
  CPC .. *H01L 21/02164* (2013.01); *H01L 21/02236* (2013.01); *H01L 29/40114* (2019.08); *H01L 29/40117* (2019.08); *H01L 29/4991* (2013.01); *H01L 29/513* (2013.01); *H01L 29/517* (2013.01); *H01L 29/7883* (2013.01); *H01L 29/792* (2013.01); *H10B 41/27* (2023.02)

(56) References Cited

U.S. PATENT DOCUMENTS

| | | | |
|---|---|---|---|
| 2017/0098659 A1* | 4/2017 | Yoshimizu | H01L 21/0217 |
| 2017/0229474 A1 | 8/2017 | Shimizu | |
| 2017/0365614 A1 | 12/2017 | Tang | |
| 2018/0219017 A1 | 8/2018 | Goda | |
| 2019/0051656 A1 | 2/2019 | Carlson | |
| 2019/0198520 A1* | 6/2019 | Kim | H01L 29/66833 |

OTHER PUBLICATIONS

WO PCT/US2020/042432 Srch Rpt, Oct. 29, 2020, Micron Technology, Inc.
WO PCT/US2020/042432 Wtn Opn, Oct. 29, 2020, Micron Technology, Inc.

\* cited by examiner

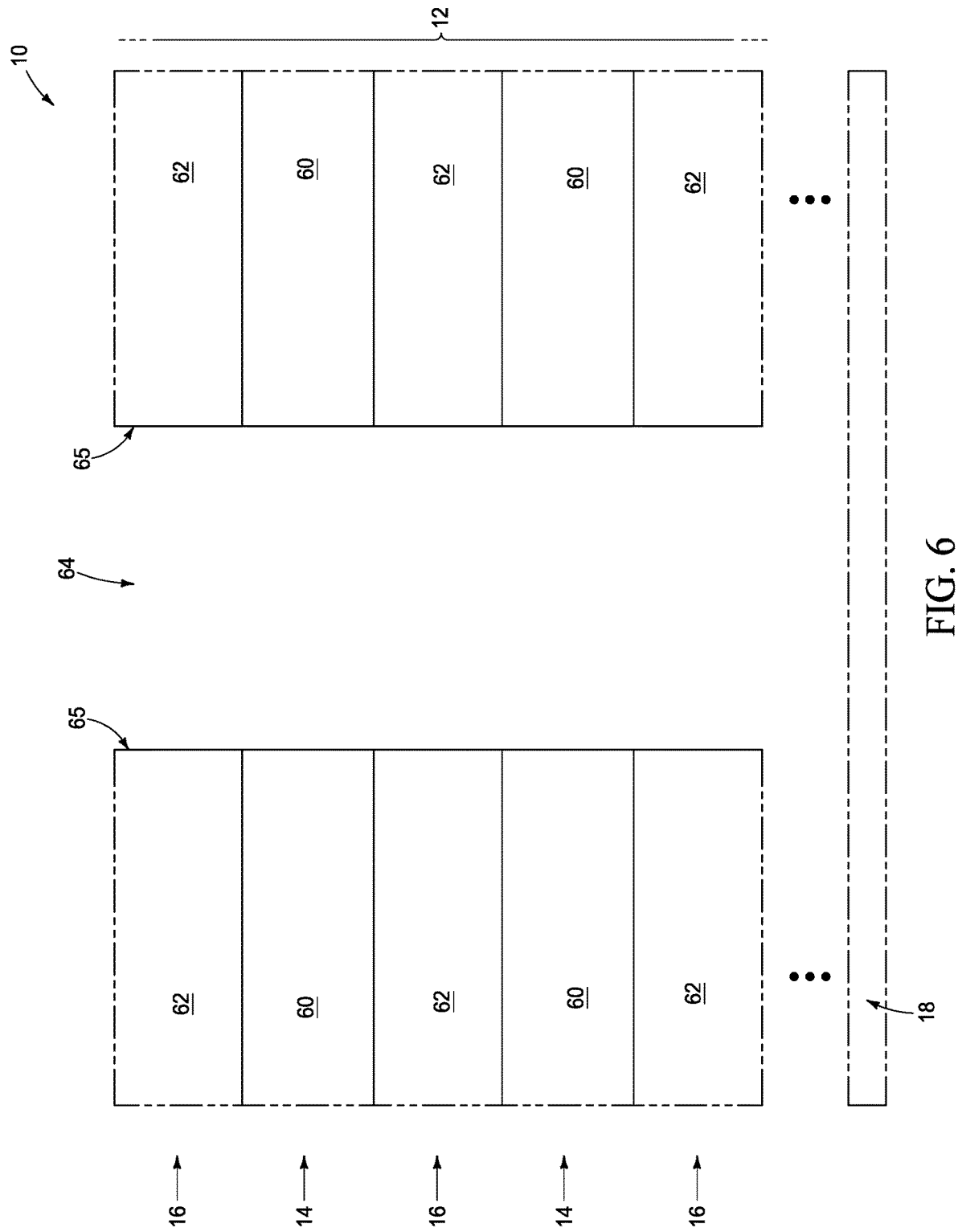

INTEGRATED ASSEMBLIES HAVING VERTICALLY-SPACED CHANNEL MATERIAL SEGMENTS, AND METHODS OF FORMING INTEGRATED ASSEMBLIES

RELATED PATENT DATA

This patent resulted from divisional application of U.S. patent application Ser. No. 16/548,320, filed Aug. 22, 2019, the disclosures of which are incorporated herein by reference.

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 5 and 6 are diagrammatic cross-sectional side views of a region of an integrated assembly shown at example sequential process stages of an example method for forming an example NAND memory array.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may advantageously impede migration of charge between memory cells. Example embodiments are described with reference to FIGS. 5-41.

Figure 1:
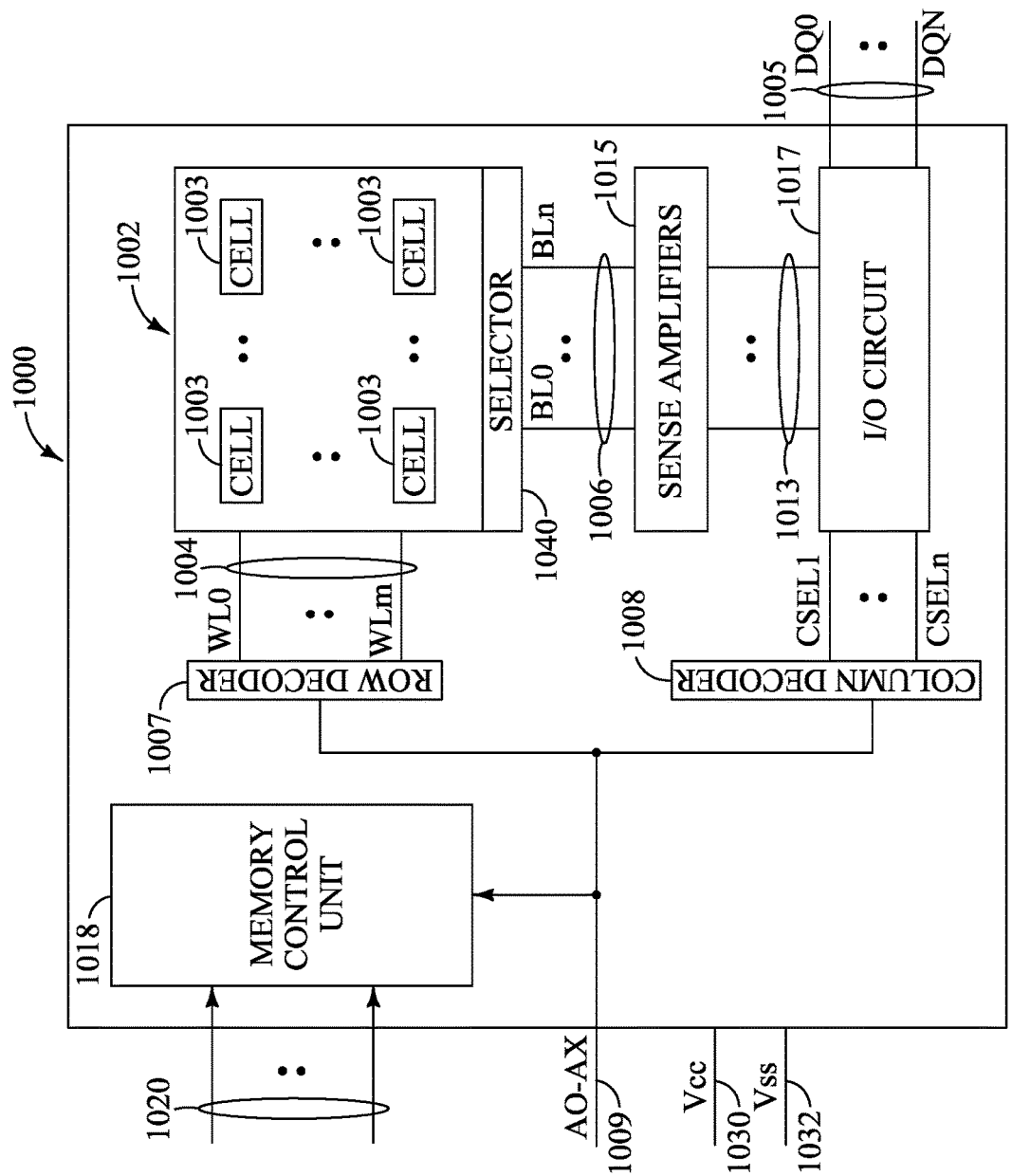
FIG. 1 shows a block diagram of a prior art memory device having a memory array with memory cells.
Figure 2:
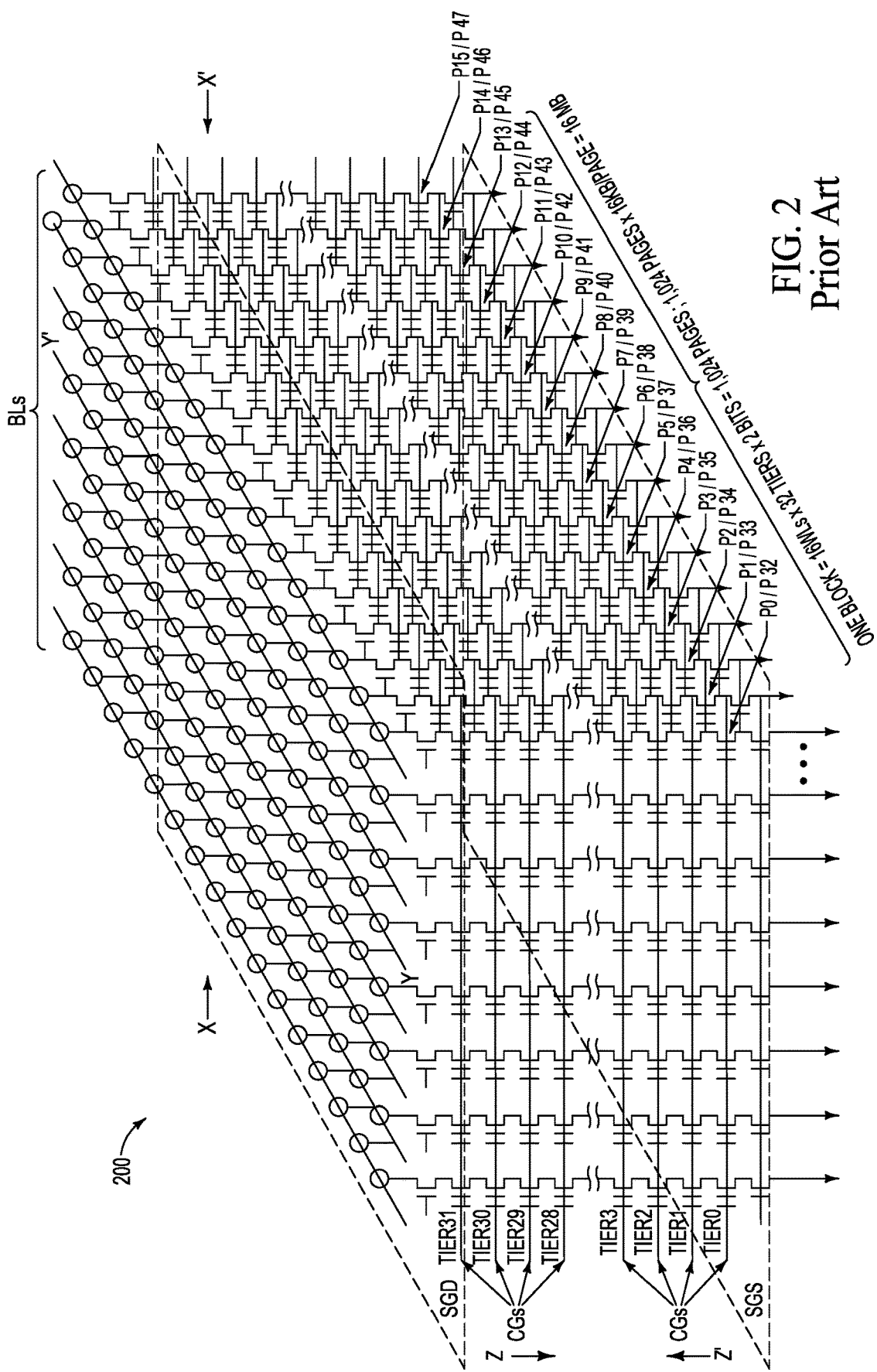
FIG. 2 shows a schematic diagram of the prior art memory array of FIG. 1 in the form of a 3D NAND memory device.
Figure 3:
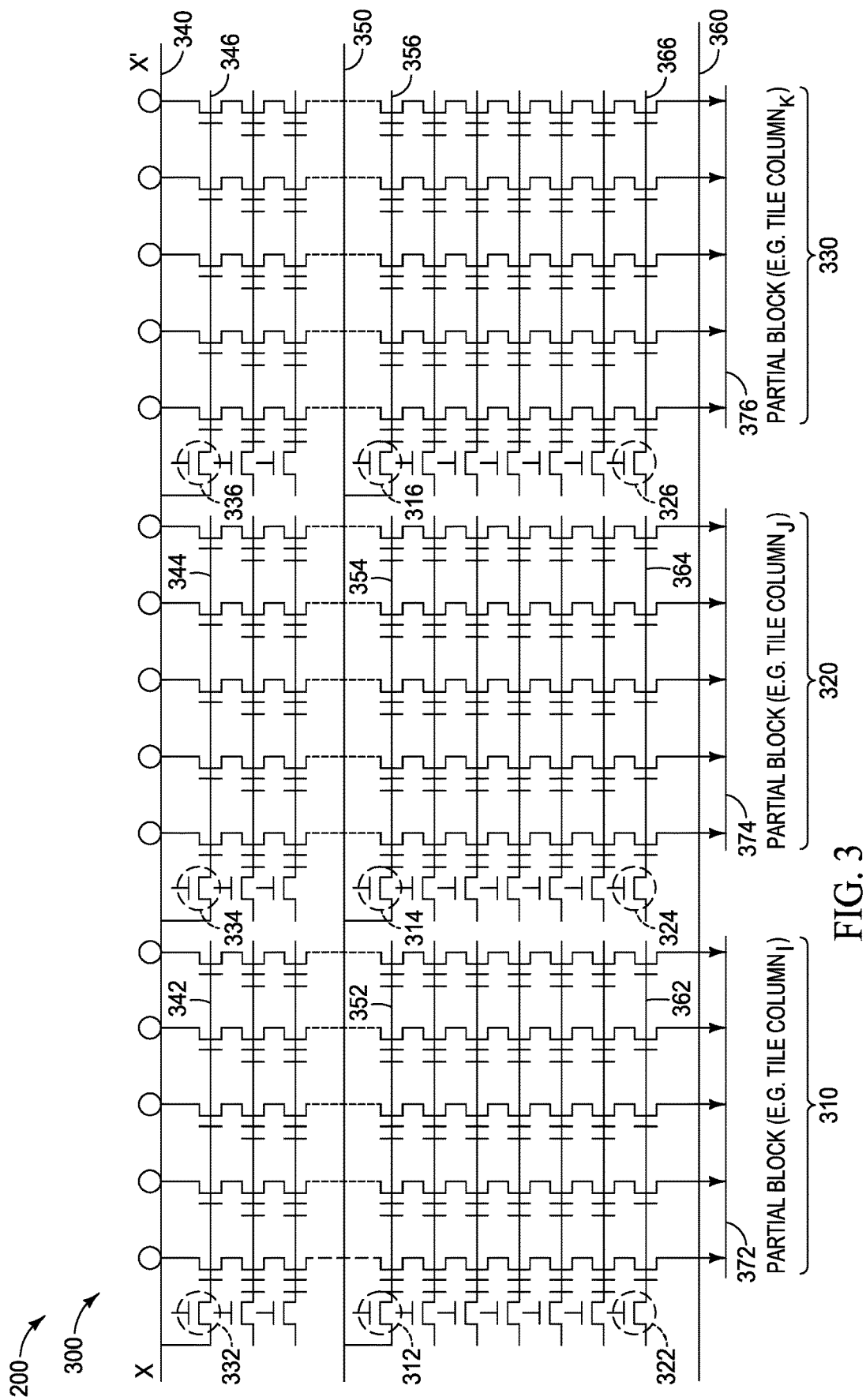
FIG. 3 shows a cross-sectional view of the prior art 3D NAND memory device of FIG. 2 in an X-X' direction.
Figure 4:
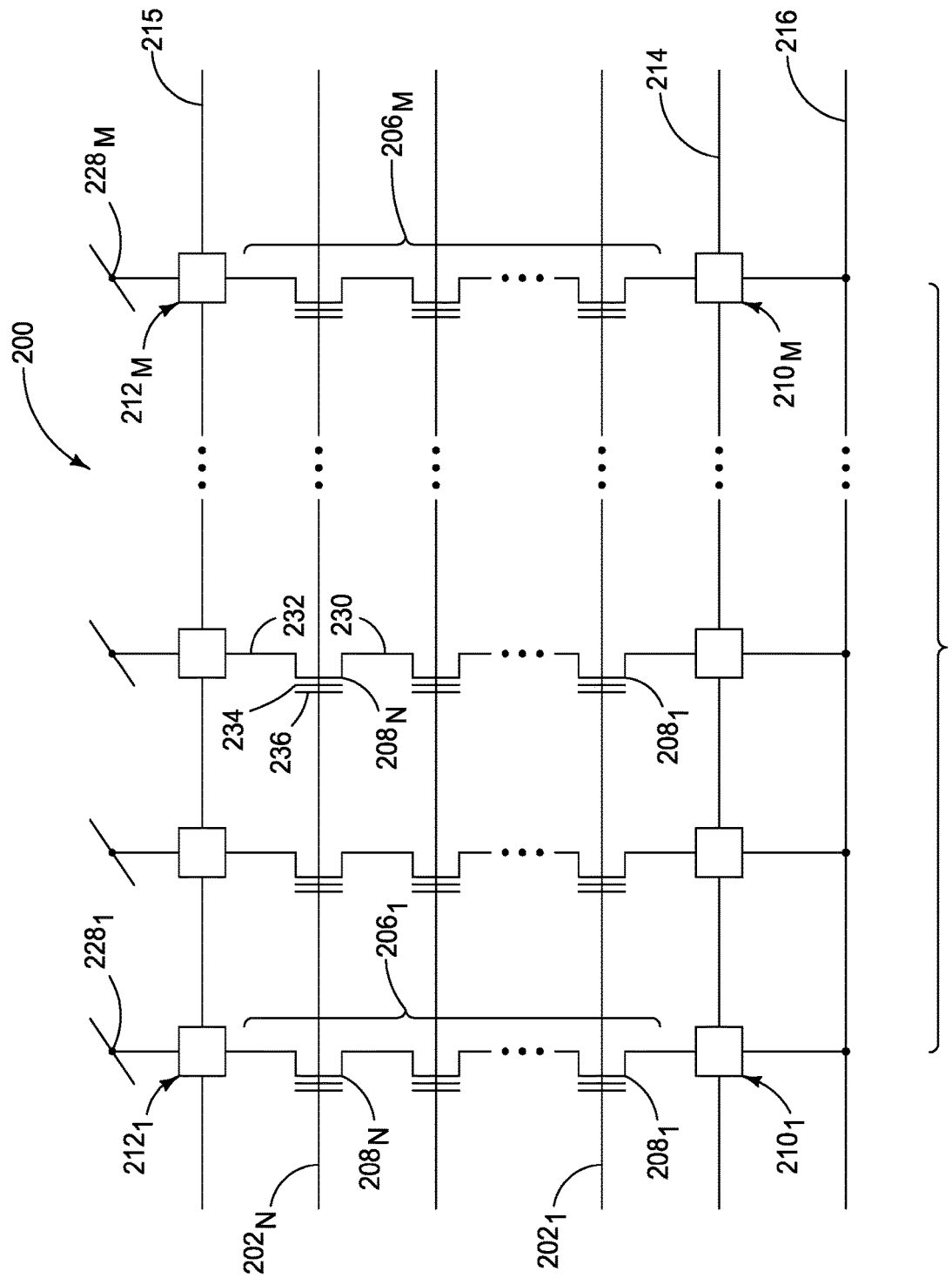
FIG. 4 is a schematic diagram of a prior art NAND memory array.
Figure 5:
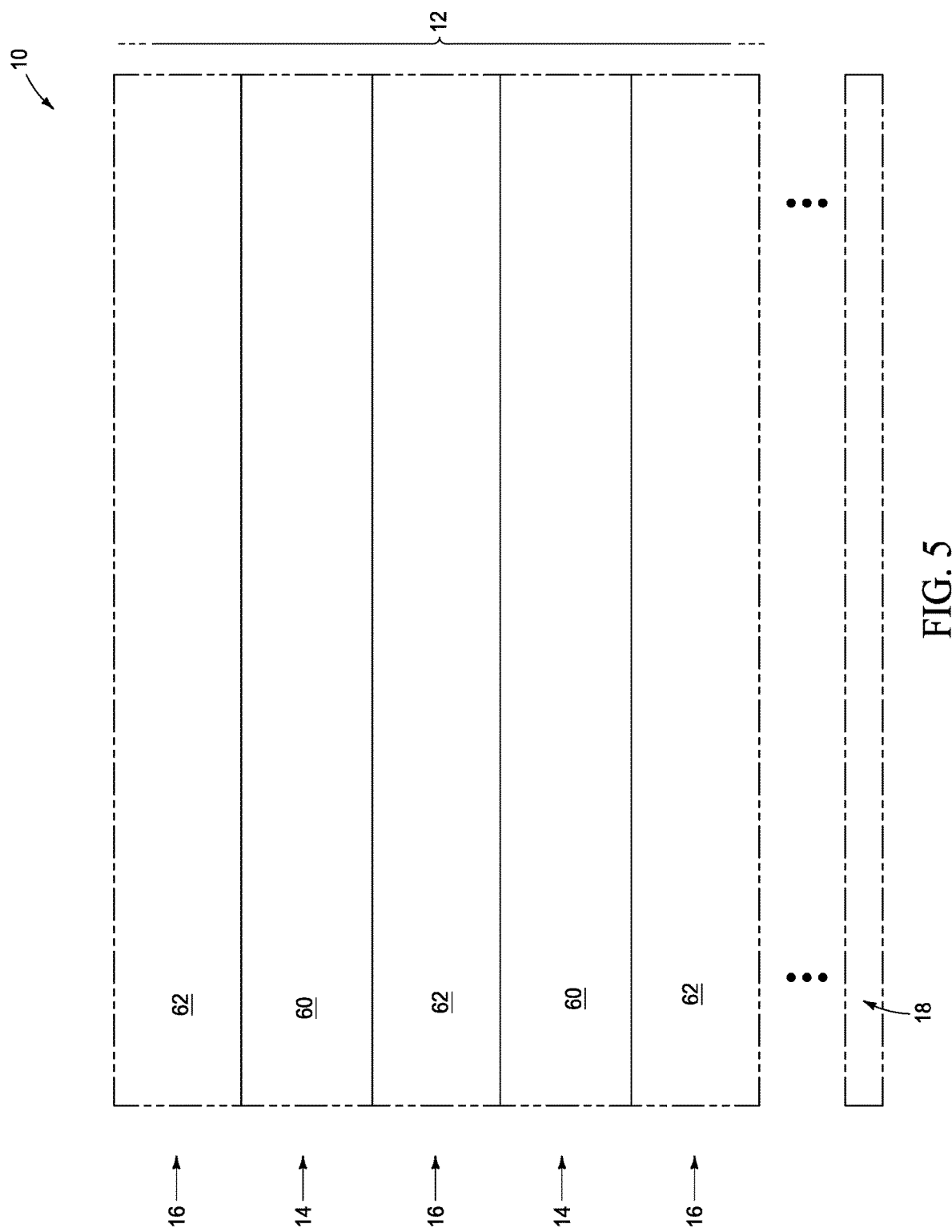

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Referring to FIG. 6, an opening 64 is formed to extend through the stack 12. The opening has sidewalls 65 extending along the first and second materials 60 and 62.

Figure 6A:
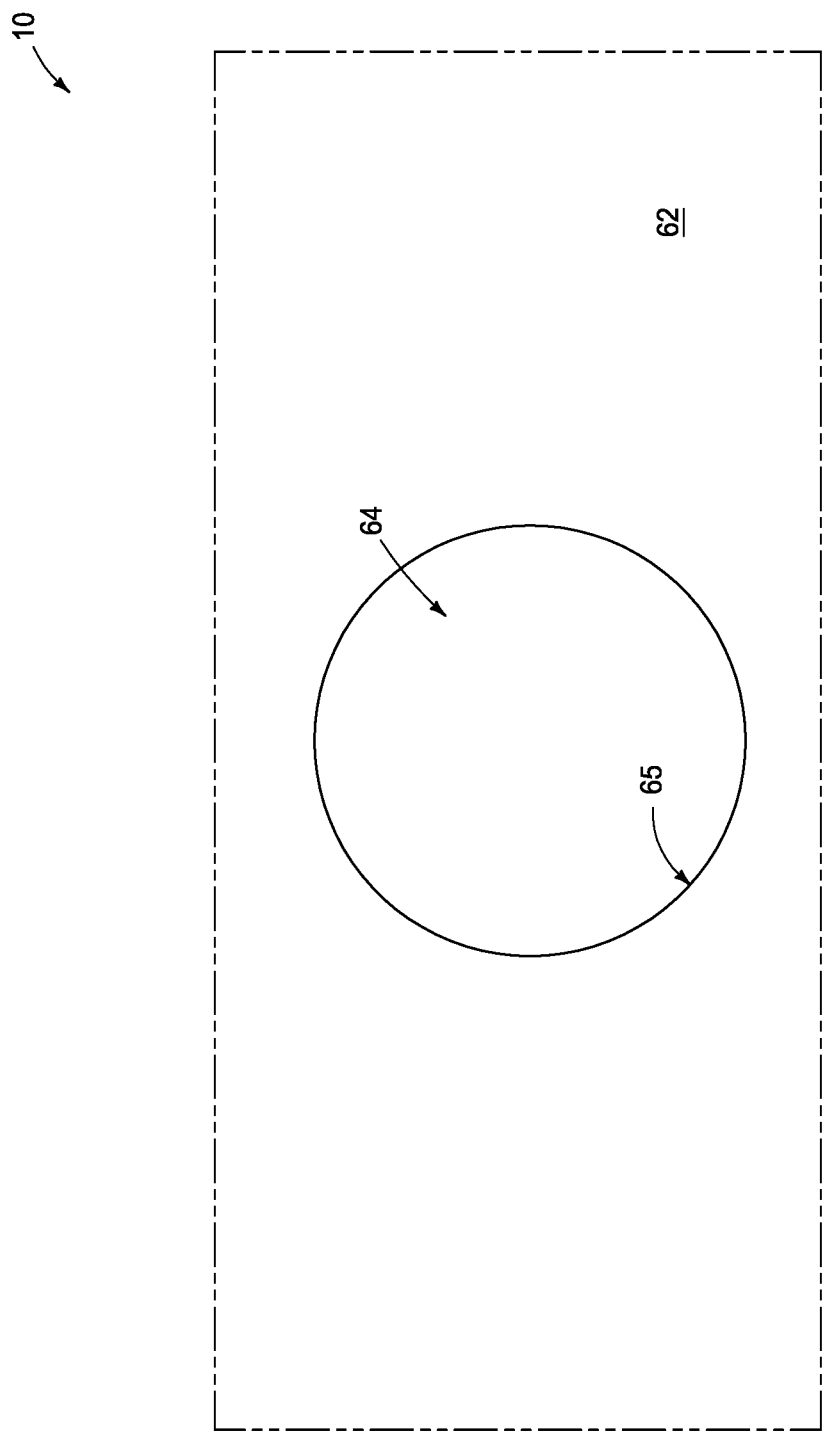
FIG. 6A is a diagrammatic top view of a portion of the integrated assembly of FIG. 6.

FIG. 6A is a top view of a region of the assembly 10 at the process stage of FIG. 6, and shows that the opening 64 may have a closed shape (circular, elliptical, square or other polygonal, etc.) when viewed from above. In the illustrated embodiment, the opening 64 is circular when viewed from above. The sidewalls 65 along the cross-section of FIG. 6 are part of a continuous sidewall 65, as shown by the top view of FIG. 6A. The sidewall 65 may be referred to as a peripheral sidewall of the opening, or as a peripheral sidewall surface of the opening. The terms "peripheral sidewall" and "peripheral sidewall surface" may be utilized interchangeably. The utilization of one term in some instances and the other in other instances may be to provide language variation within this disclosure to simplify antecedent basis within the claims that follow.

The opening 64 may be representative of a large number of substantially identical openings formed at the process stage of FIGS. 6 and 6A and utilized for fabricating NAND memory cells of a NAND memory array. The term "substantially identical" means identical to within reasonable tolerances of fabrication and measurement.

Figure 7:
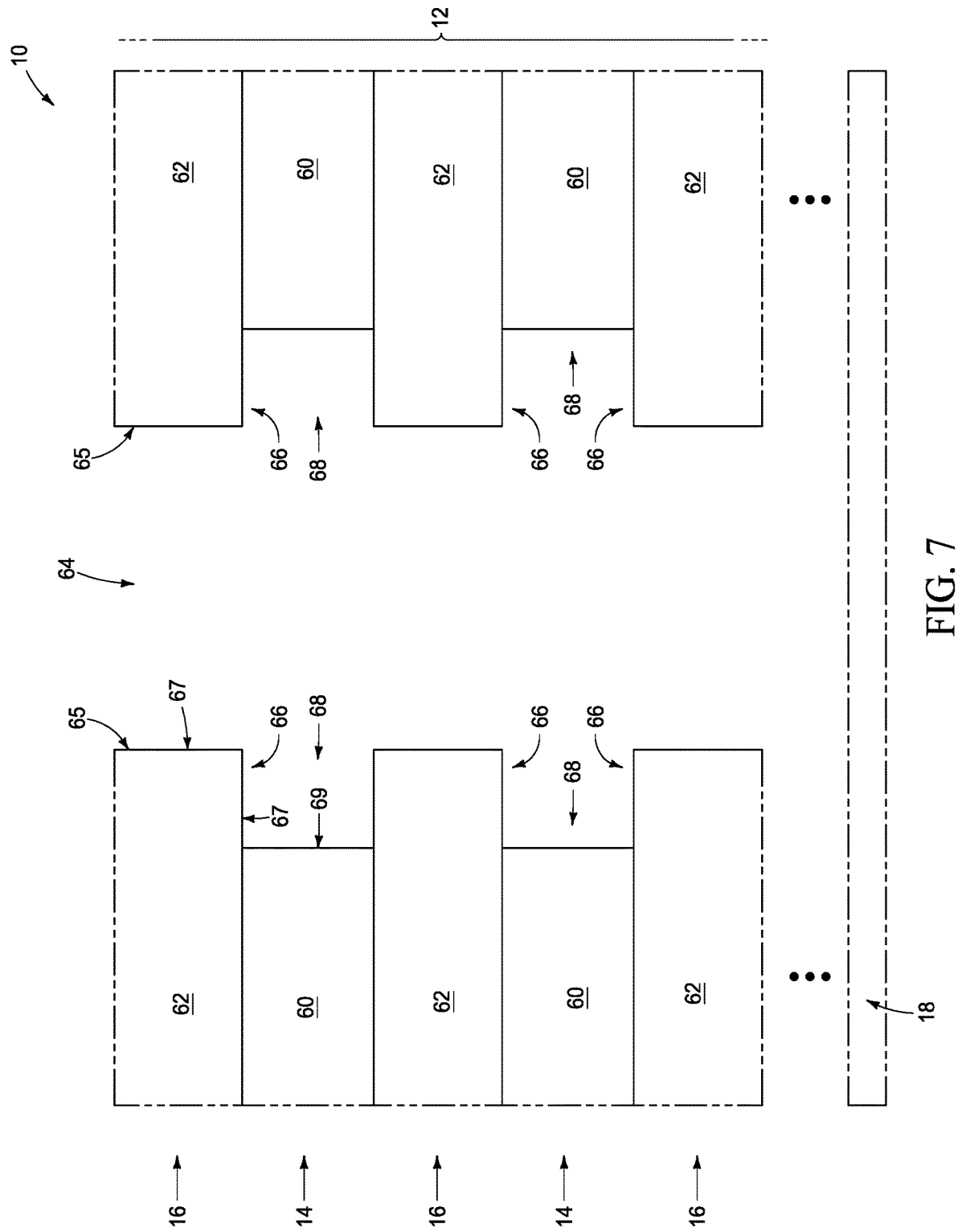
FIGS. 7-19 are diagrammatic cross-sectional side views of the region of the integrated assembly of FIG. 5 shown at example sequential process stages of an example method for forming an example NAND memory array. The process stage of FIG. 7 may follow that of FIG. 6.

Referring to FIG. 7, the first levels 14 are recessed relative to the second levels 16 along the sidewalls 65 of the opening 64. After the recessing, the second levels 16 have projecting terminal ends 66 which extend beyond the recessed first levels 14. The terminal ends 66 have surfaces 67 of the second material 62. The recessed first levels 14 have surfaces 69 of the first material 60. Cavities (gaps) 68 are vertically between the terminal ends 66. The surfaces 69 may be considered to be along inner edges of the cavities 68.

The surfaces 67 and 69 together form the peripheral sidewall surface 65 of the opening 64 to be an undulating sidewall surface at the process stage of FIG. 7.

Figure 8:
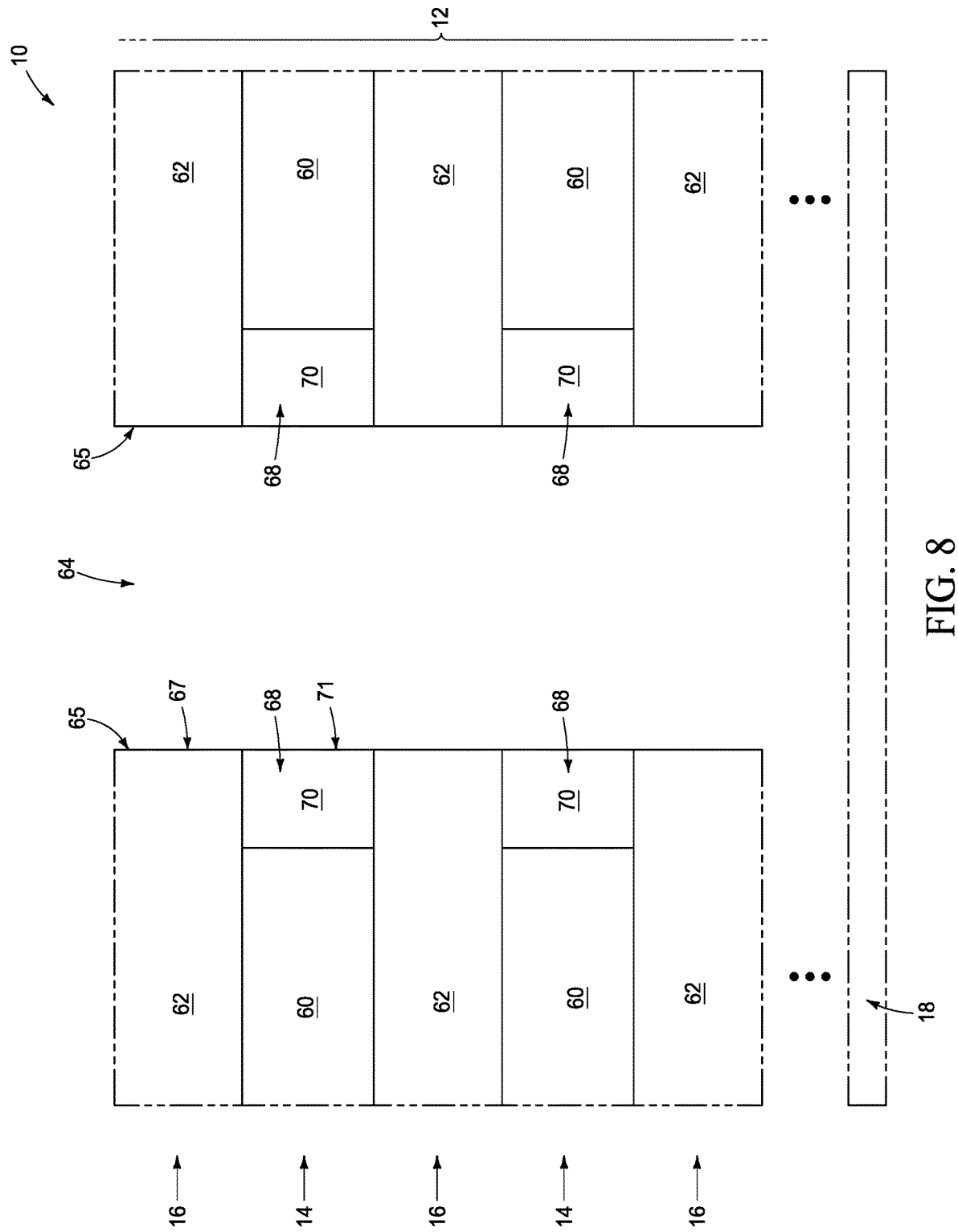

Referring to FIG. 8, the cavities 68 are filled with sacrificial material 70. The sacrificial material 70 may comprise any suitable composition(s); and in some embodiments may comprise, consist essentially of, or consist of silicon (e.g., polycrystalline silicon).

The sacrificial material 70 has surfaces 71 along the sidewall 65 of the opening 64. In the illustrated embodiment, the surfaces 71 are formed to be aligned with the surfaces 67 of the second material 62 to form the peripheral sidewall surface 65 of the opening 64 to be a substantially straight sidewall surface (and in the shown embodiment to extend substantially vertically). The term "substantially straight" means straight to within reasonable tolerances of fabrication and measurement, and the term "substantially vertically" means vertical to within reasonable tolerances of fabrication and measurement.

Figure 9:
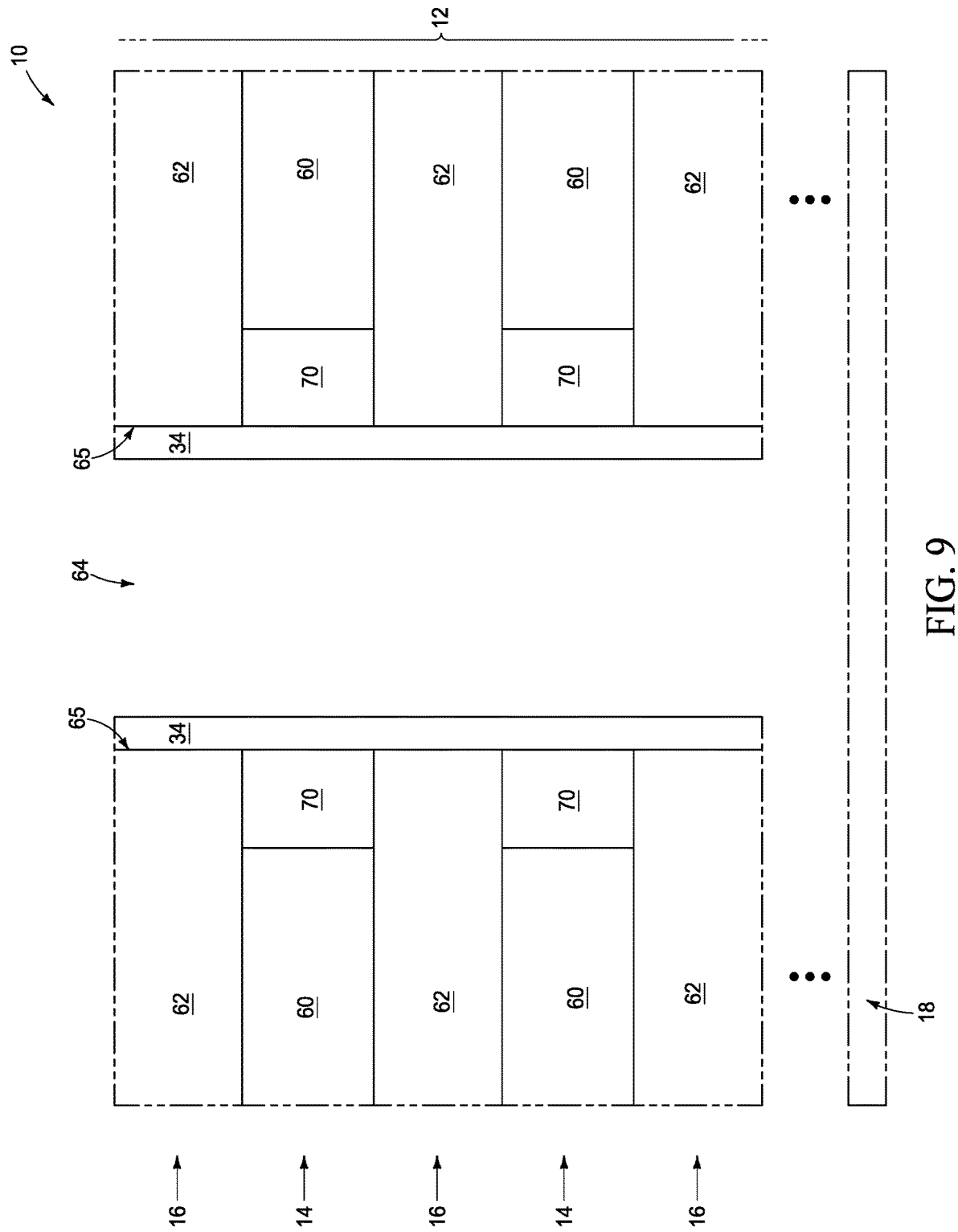

Referring to FIG. 9, charge-blocking material 34 is formed along the substantially straight sidewall surface 65 (i.e., along the peripheral sidewall of the opening 64). The charge-blocking material 34 may comprise any suitable composition(s); and in some embodiments may comprise, consist essentially of, or consist of one or both of silicon oxynitride (SiON) and silicon dioxide (SiO$_2$).

The charge-blocking material 34 has a substantially flat topography along the substantially straight sidewall surface 65.

Figure 10:
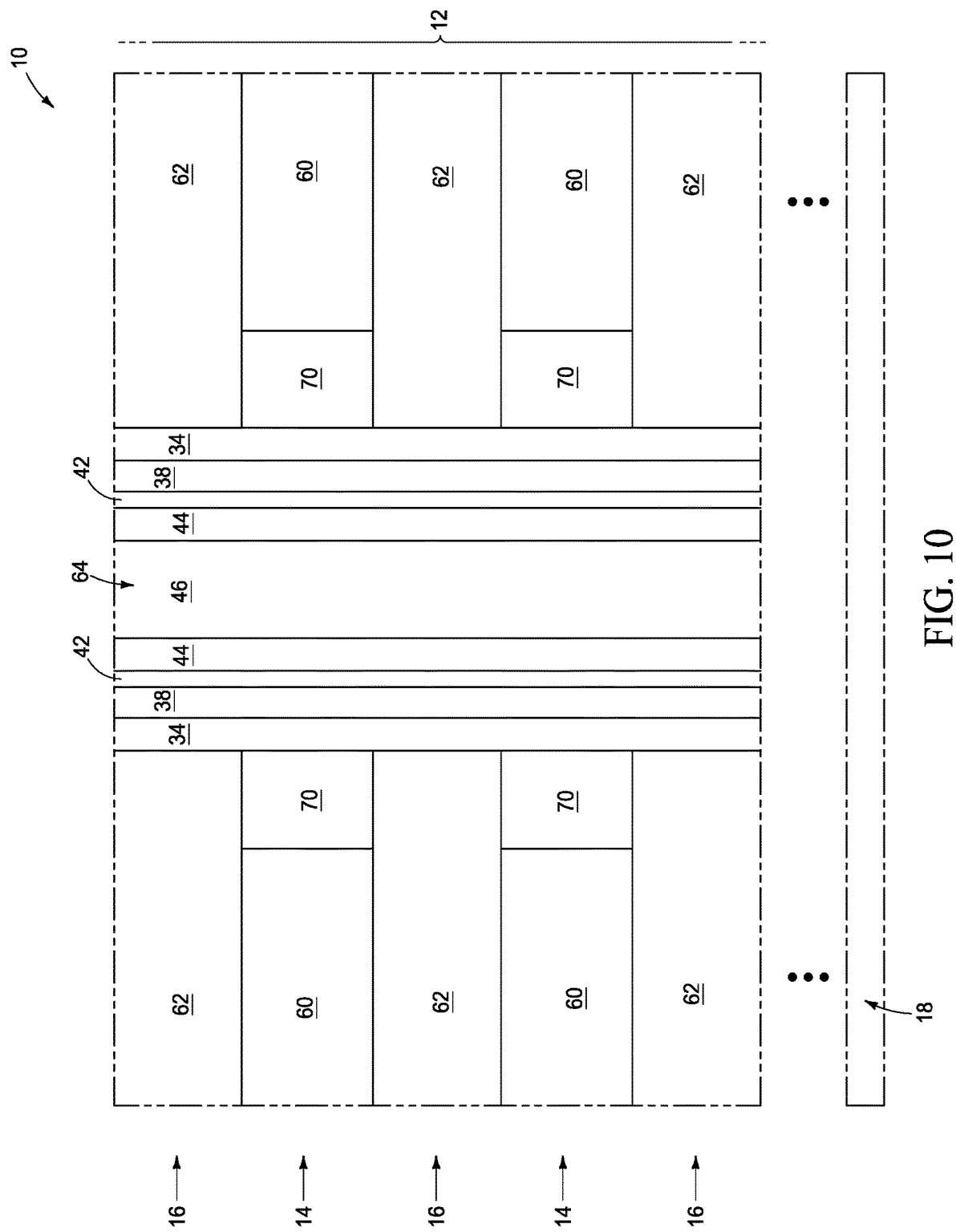

Referring to FIG. 10, charge-storage material 38 is formed adjacent the charge-blocking material 34. The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

The charge-storage material 38 is formed along the flat topography of the charge-blocking material 34, and has a flat configuration in the illustrated embodiment of FIG. 10. The term "flat configuration" means that the material 38 is of substantially continuous thickness and extends substantially vertically straight, as opposed to being undulating.

Gate-dielectric material (i.e., tunneling material, charge-passage material) 42 is formed adjacent the charge-storage material 38. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is formed adjacent the gate-dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is formed adjacent the channel material 44, and fills a remaining portion of the opening 64. The insulative material 46 may comprise any suitable composition(s); and in some embodiments may comprise, consist essentially of, or consist of silicon dioxide.

In the illustrated embodiment of FIG. 10, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

Figure 11:
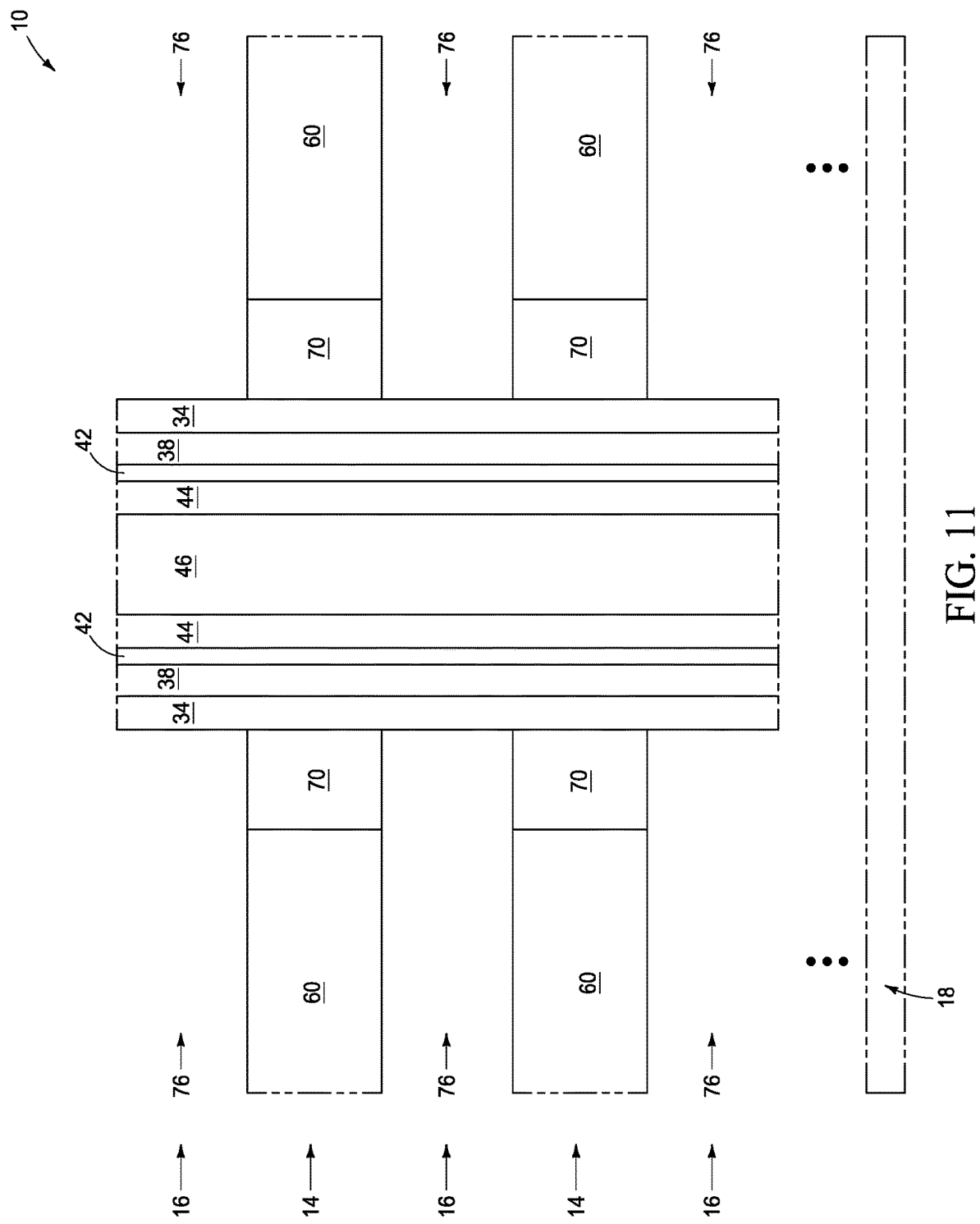

Referring to FIG. 11, the second material 62 (FIG. 10) is removed to leave voids 76. The voids 76 may be referred to as first voids to distinguish them from other voids which are formed at later process stages.

Figure 12:
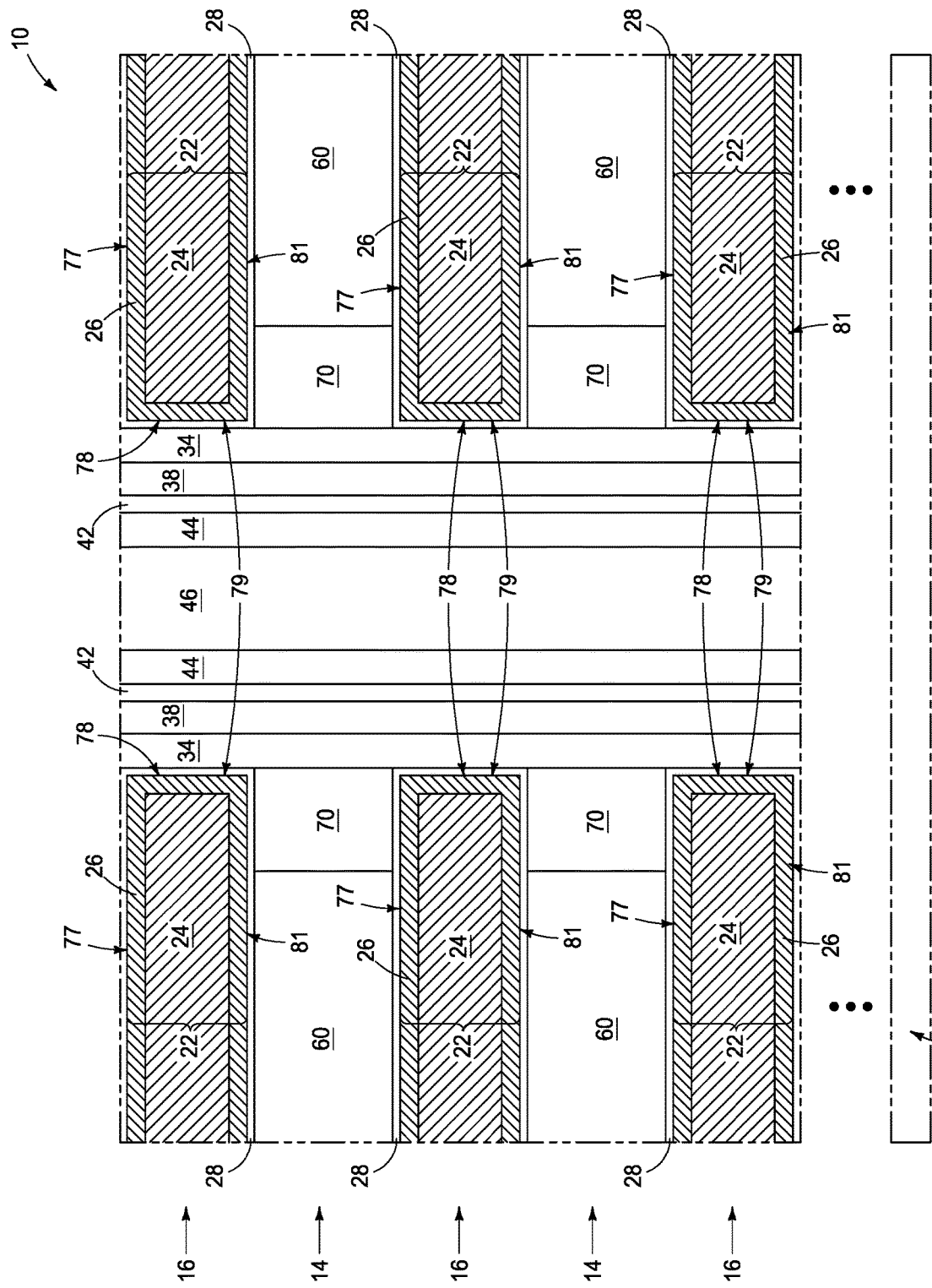

Referring to FIG. 12, high-k dielectric material 28 is formed within the first voids 76 (FIG. 11) to line the first voids, and then conductive regions 22 are formed within the lined voids.

The term "high-k" means a dielectric constant greater than that of silicon dioxide. In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The high-k dielectric material 28 has a substantially uniform thickness along the interior peripheries of the voids 76 (FIG. 11), with the term "substantially uniform" meaning uniform to within reasonable tolerances of fabrication and measurement. The high-k dielectric material 28 may be formed to any suitable thickness; and in some embodiments may be formed to a thickness within a range of from about 1 nm to about 5 nm.

The conductive regions 22 may comprise two or more conductive materials; and in the shown embodiment comprise a pair of conductive materials 24 and 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments the core material 24 may comprise one or more metals (e.g., may comprise tungsten), and the outer conductive material 26 may comprise one or more metal nitrides (e.g., may comprise titanium nitride).

In the shown embodiment, the high-k dielectric material 28 is directly against the conductive material 26.

The levels 16 may be considered to be conductive levels at the process stage of FIG. 12, with such conductive levels comprising the conductive regions 22.

The conductive regions 22 have front ends 78 facing the vertically-extending materials 34, 38, 42 and 44. The front ends 78 have front surfaces 79 which also face the vertically-extending materials 34, 38, 42 and 44. The conductive levels have upper surfaces (top surfaces) 77 and lower surfaces (i.e., bottom surfaces) 81 which extend back from the front surfaces 79.

Figure 13:
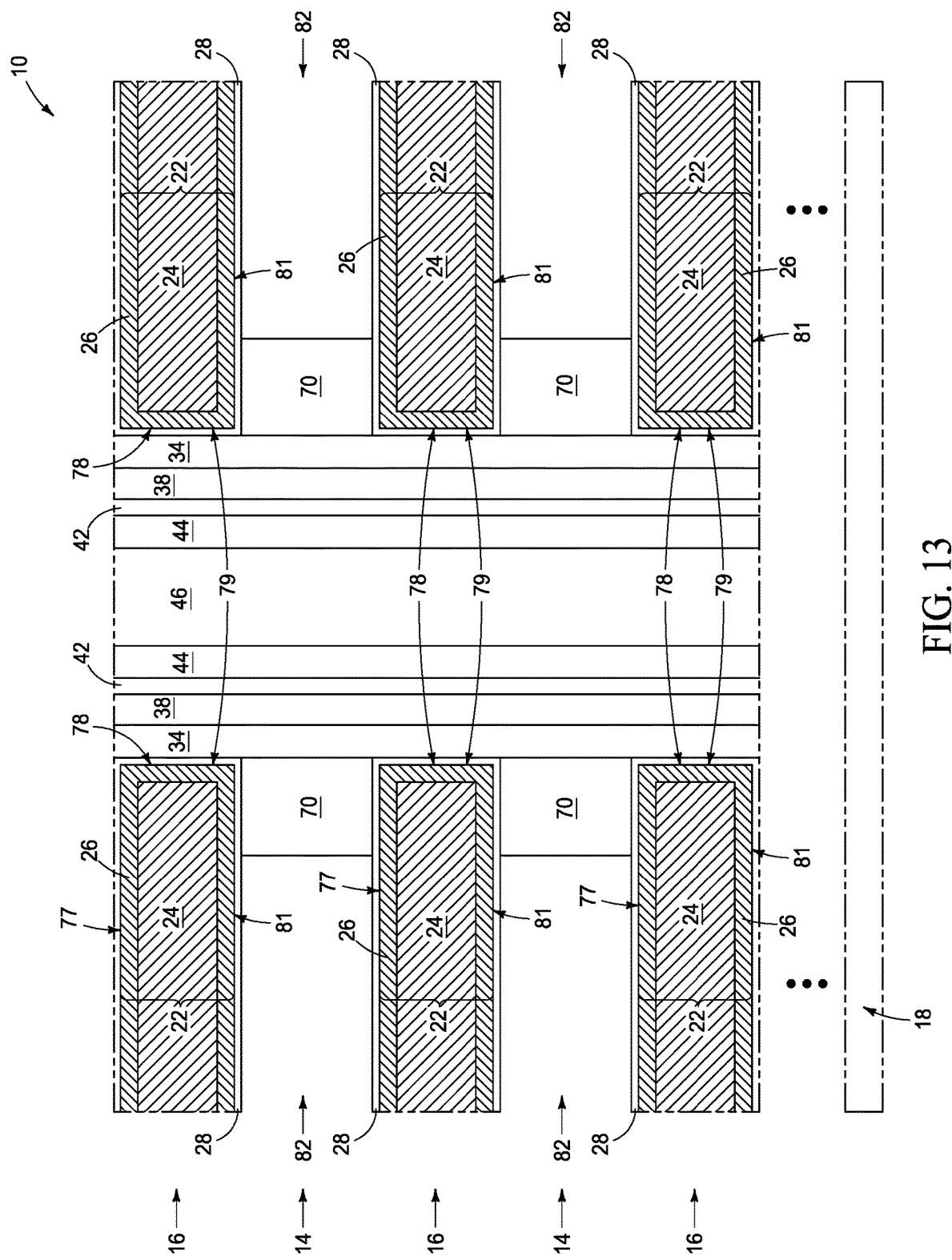

Referring to FIG. 13, the first material 60 (FIG. 12) is removed to form second voids 82.

Figure 14:
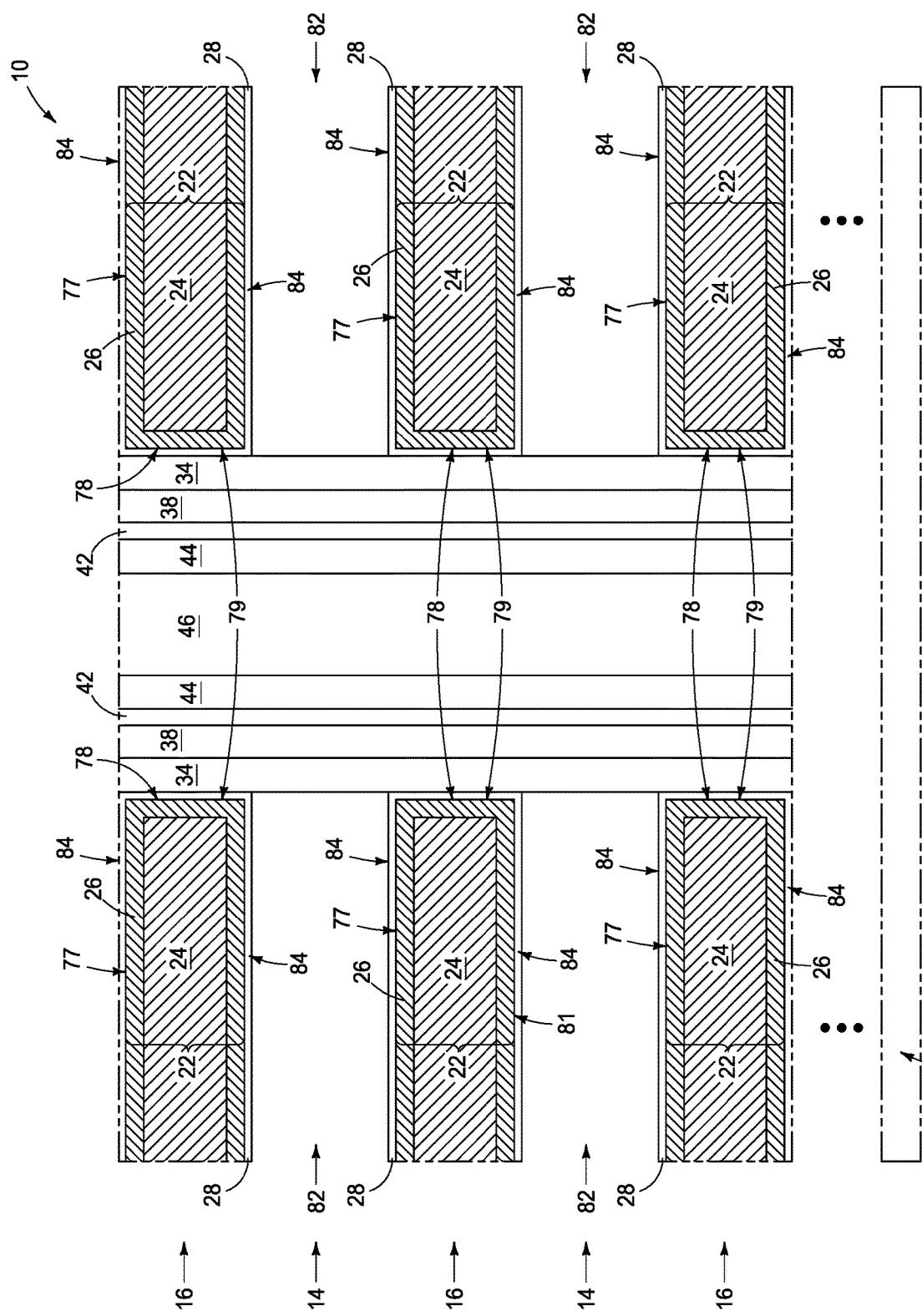

Referring to FIG. 14, the sacrificial material 70 (FIG. 13) is removed to extend the second voids 82.

After the materials 60 (FIG. 12) and 70 (FIG. 13) are removed, the high-k material 28 has exposed portions 84 along the upper and lower surfaces 77 and 81 of the conductive regions 22.

Figure 15:
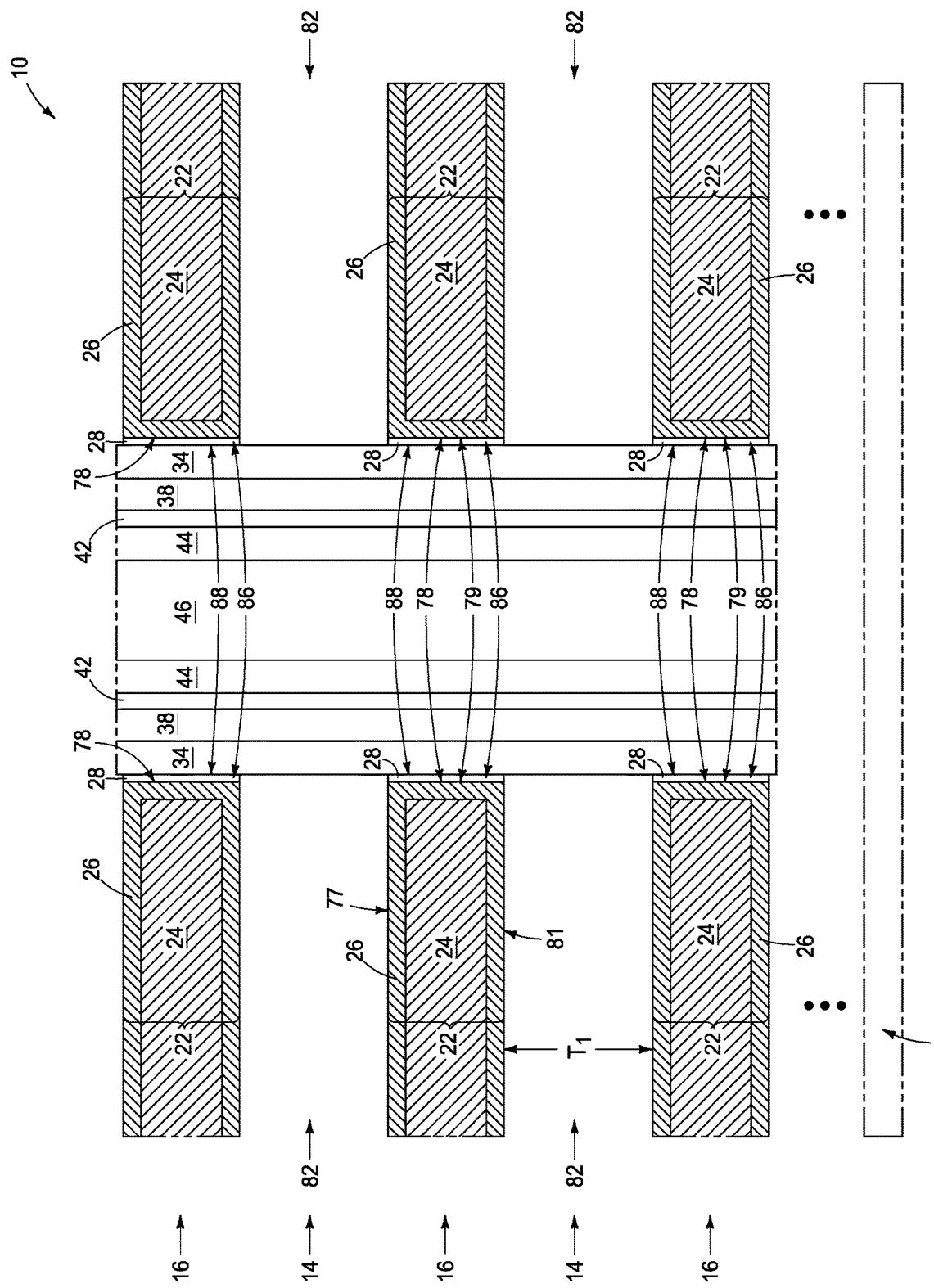

Referring to FIG. 15, the exposed portions 84 (FIG. 14) of the high-k dielectric material 28 are removed to leave remaining portions 86 of the high-k dielectric material 28 along the front ends 78 of the conductive regions 22. The remaining portions 86 of the high-k dielectric material are configured as vertically-extending linear segments 88, with such linear segments being vertically-spaced from one another. In the illustrated embodiment of FIG. 15, the segments 88 are vertically-spaced from another by gaps along the second levels 14 (with such gaps being portions of the voids 82). The segments 88 of the high-k dielectric material 28 are directly against the front surfaces 79 of the conductive regions 22, and are between such front surfaces and the charge-blocking material 34. Notably, the high-k dielectric material 28 remains only along the front surfaces 79 of the conductive regions 22, and does not wrap around the front ends 78 of the conductive regions 22 (i.e., the high-k dielectric material 28 does not extend along the top and bottom surfaces 77 and 81 of the conductive regions 22).

The voids 82 may be considered to have a first vertical thickness $T_1$ at the process stage of FIG. 15.

Figure 16:
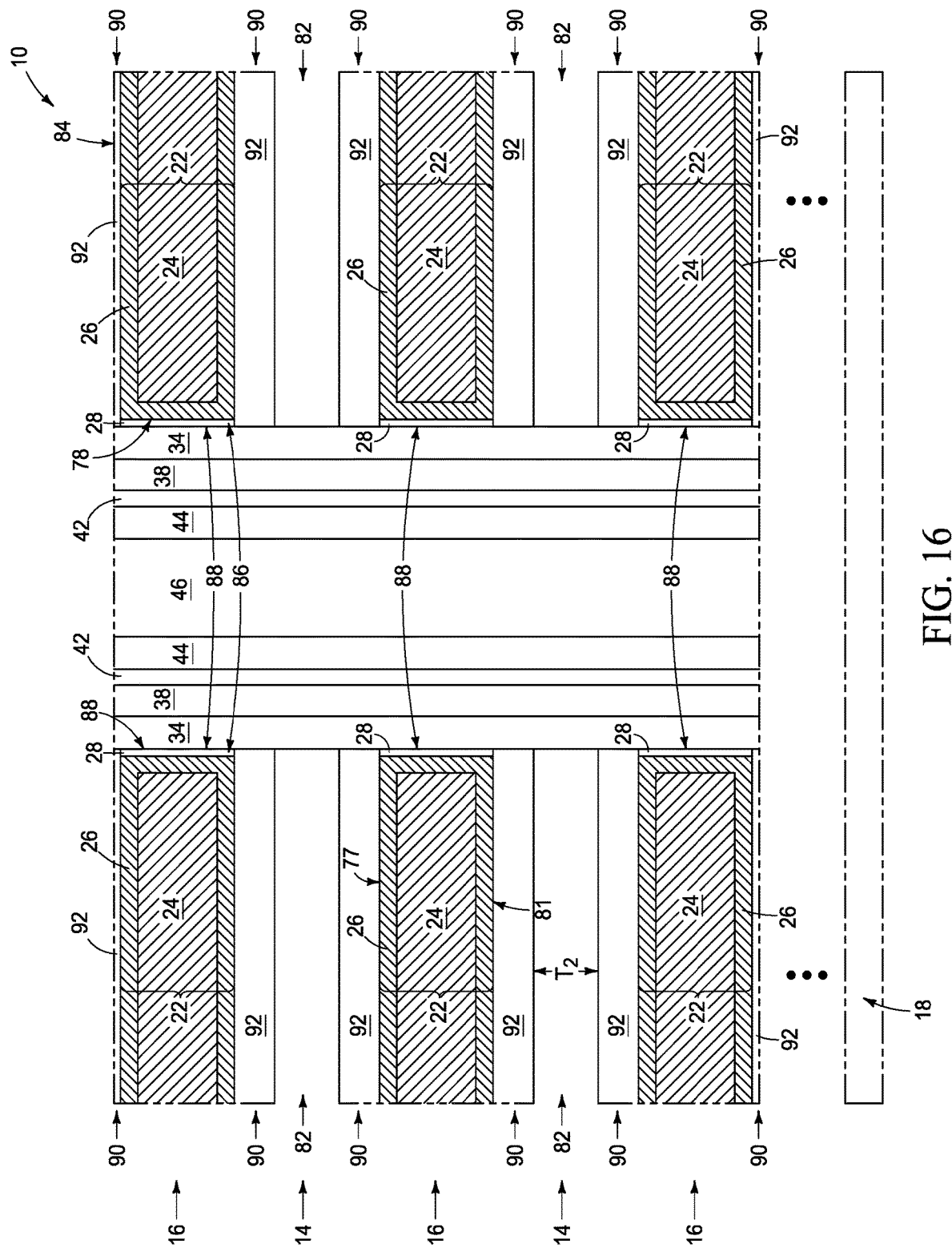

Referring to FIG. 16, strips 90 are formed within the second voids 82 to narrow the second voids to a second vertical thickness $T_2$. The strips 90 comprise strip material 92. The strip material 92 may comprise any suitable composition(s). In some embodiments, the strips 90 comprise sacrificial material 92. Such sacrificial material may be electrically insulative or electrically conductive; and in some embodiments may comprise, consist essentially of, or consist of silicon nitride. In some embodiment, the strips 90 may comprise insulative material 92 which remains in a final construction.

Figure 17:
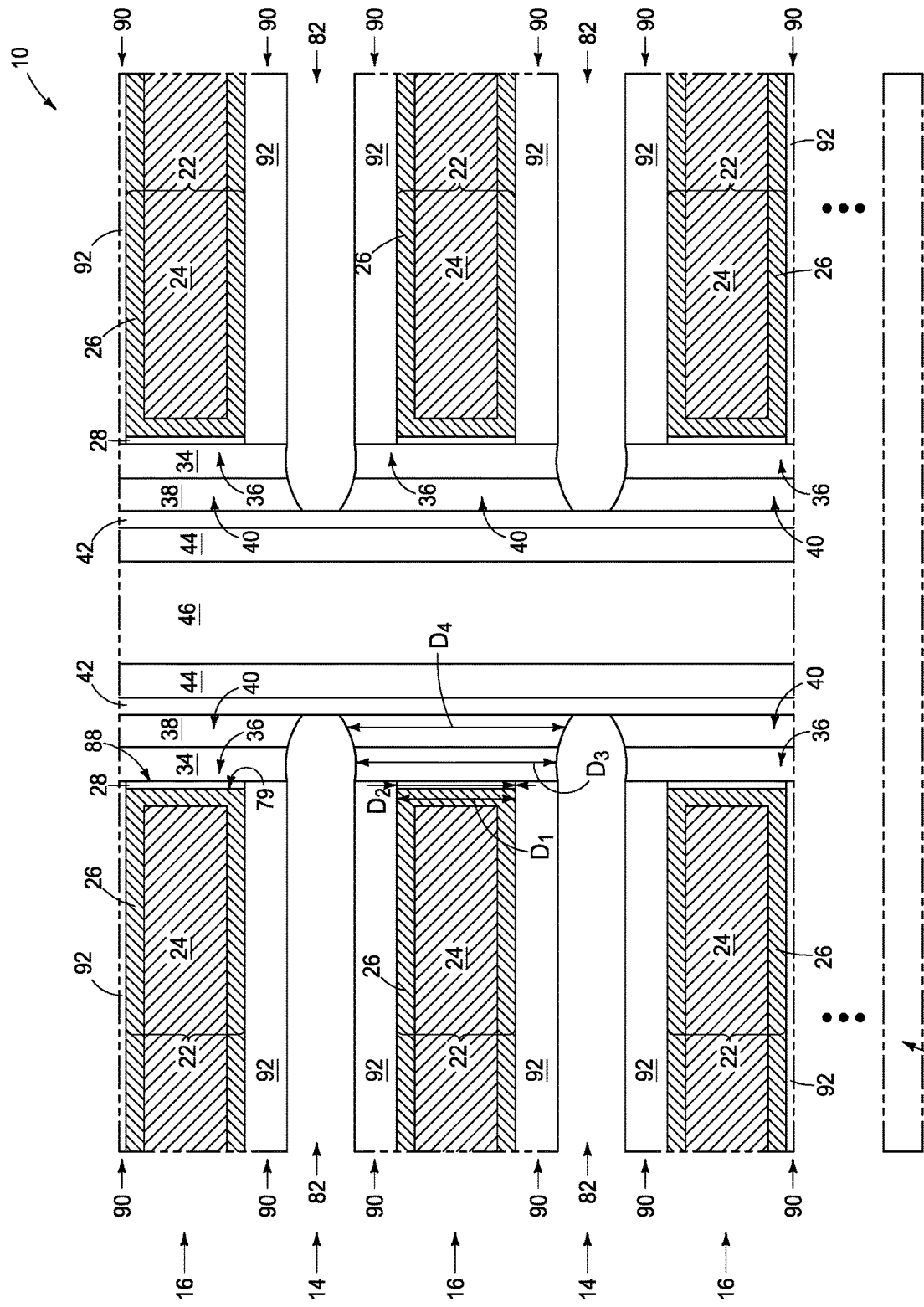

Referring to FIG. 17, the second voids 82 are extended through the charge-blocking material 34, and then are extended through the charge-storage material 38. The extended voids 82 divide the charge-blocking material 34 into vertically-spaced linear segments 36 and divide the charge-storage material into vertically-spaced linear segments 40. In some embodiments, the segments 88 of the high-k dielectric material 28 may be referred to as first segments, the segments 36 of the charge-blocking material 34 may be referred to as second segments, and the segments 40 of the charge-storage material 38 may be referred to as third segments. In the shown embodiment, the segments 36 of the charge-blocking material 34 are directly adjacent the segments 88 of the high-k dielectric material 28; and the segments 40 of the charge-storage material 38 are directly adjacent the segments 36 of the charge-blocking material 34.

The front surfaces 79 of the conductive levels 22 have a first vertical dimension $D_1$, which may be considered to correspond to a thickness of the conductive regions 22 (or the conductive levels 16). The first segments 88 have a second vertical dimension $D_2$, the segments 36 have a third vertical dimension $D_3$, and the segments 40 have a fourth vertical dimension $D_4$. In the shown embodiment, the second vertical dimension $D_2$ is about the same as the first vertical dimension $D_1$ (with the term "about the same" meaning the same within reasonable tolerances of fabrication and measurement), the third vertical dimension $D_3$ is larger than the second vertical dimension, and the fourth vertical dimension $D_4$ is larger than the third vertical dimension. The relative sizes of the vertical dimensions $D_1$, $D_2$, $D_3$ and $D_4$ may be tailored by the thicknesses of the strips 90 (and in some embodiments, the strips 90 may be even be omitted); by the durations and compositions of the etches utilized to penetrate the various materials 28, 34 and 36; by the compositions of the materials 28, 34 and 36; etc.

It may be advantageous for the dimensions $D_2$, $D_3$ and $D_4$ to all be at least about as large as the dimension $D_1$ of the front surfaces of the conductive regions 22 so that NAND memory cells (described below) utilize the full extents of the front surfaces of the conductive regions. However, in some embodiments etching may reduce the vertical dimensions of one or more of the segments 88, 36 and 40 so that such segment(s) have vertical dimensions which are less than the vertical dimension D1 of the front surfaces 79. In such embodiments, NAND memory cells may still be formed with suitable operational characteristics for some applications.

In the illustrated embodiment of FIG. 17, the segments 36 and 40 have substantially flat configurations. Also, the channel material 44 has a substantially flat configuration. The flat channel material may positively impact string current as compared to non-flat configurations. Also, the flat segments 40 of the charge-storage material may have a favorable charge distribution.

The embodiment of FIG. 17 shows the voids 82 extending through the materials 34 and 38, and stopping at the tunneling material 42. In other embodiments, the voids 82 may be extended through the tunneling material.

Figure 18:
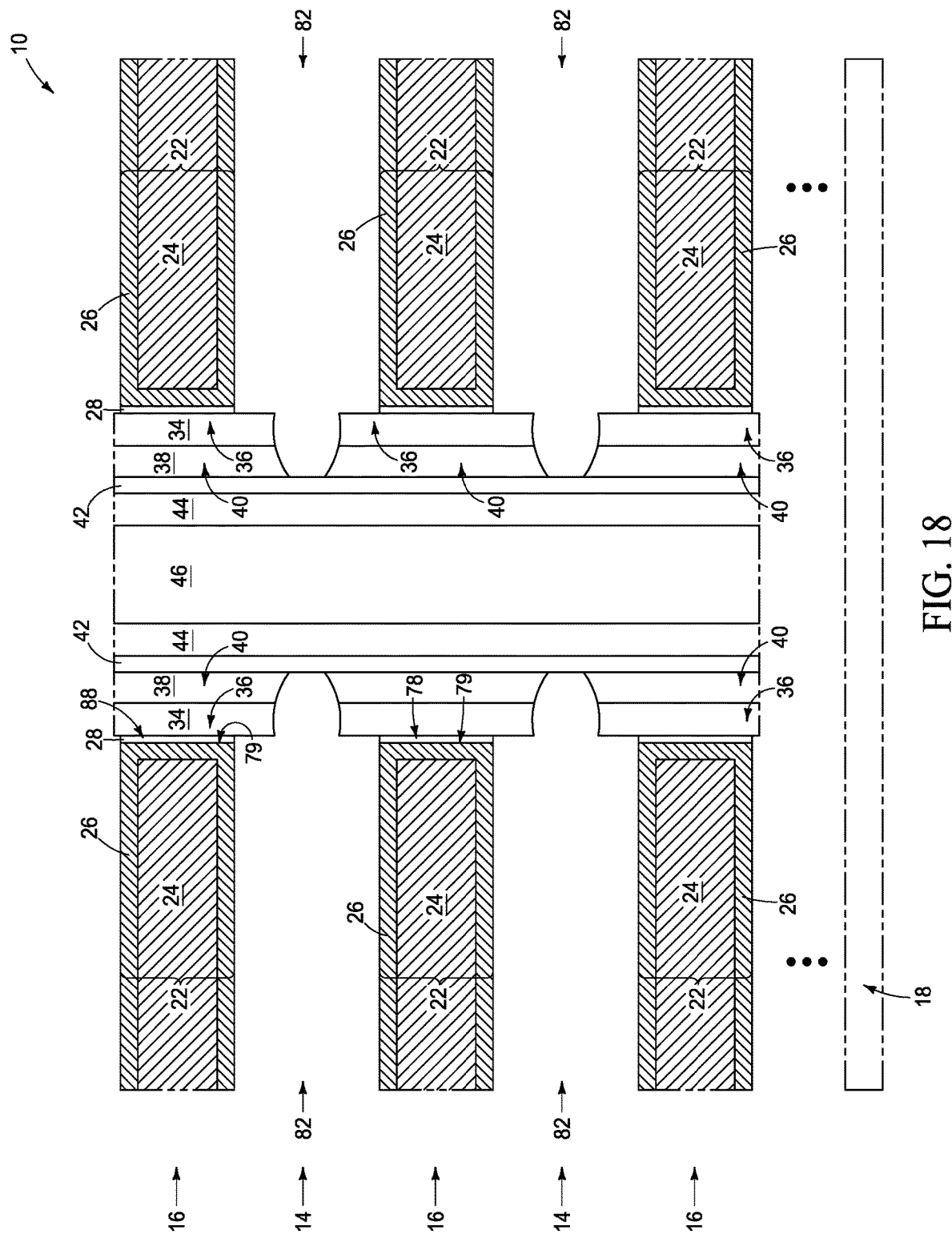

Referring to FIG. 18, the strips 90 (FIG. 17) are removed.

Figure 19:
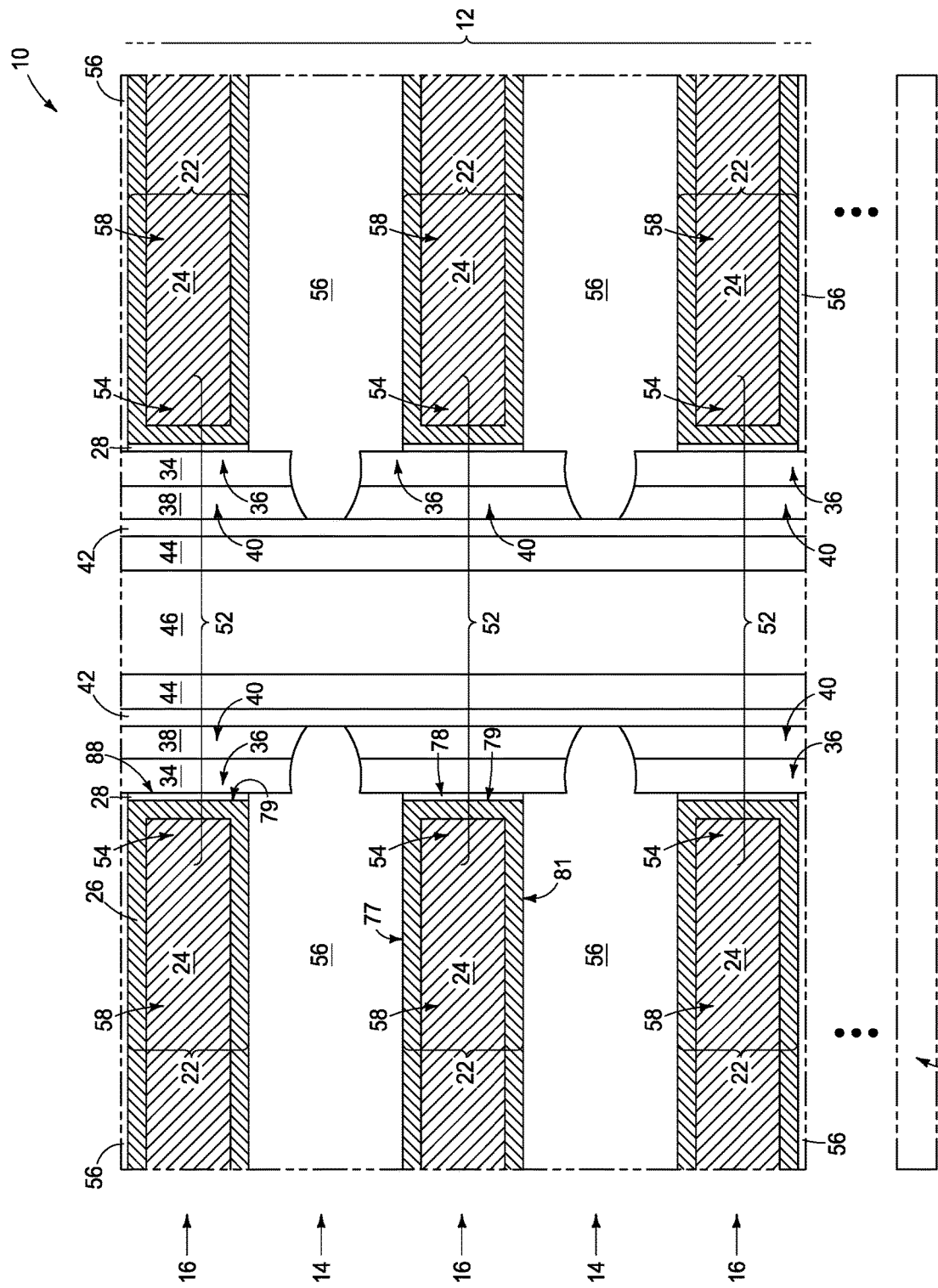

Referring to FIG. 19, insulative material 56 is formed within the second voids 82 (FIG. 18). The insulative material 56 may comprise any suitable composition(s); and in some embodiments may comprise, consist essentially of, or consist of silicon dioxide. In the illustrated embodiment of FIG. 19, the insulative material 56 entirely fills the second voids 82 (FIG. 18).

The integrated assembly 10 of FIG. 19 may be considered to comprise a stack of alternating insulative levels 14 and conductive levels 16.

The conductive levels 16 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is indicated to extend vertically beyond the illustrated region to show that there may be more vertically-stacked levels than those specifically illustrated in the diagram of FIG. 19.

NAND memory cells 52 comprise the dielectric barrier material 28, charge-blocking material 34, charge-storage material 38, gate-dielectric material 42 and channel material 44. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 52 includes a control gate region 54 within a conductive level 16. The control gate regions 54 comprise control gates analogous to those described above with reference to FIGS. 1-4. The conductive levels 16 comprise regions 58 adjacent to, or proximate, the control gate regions 54. The regions 58 may be referred to as second regions, distal regions, or wordline regions.

Figure 19A:
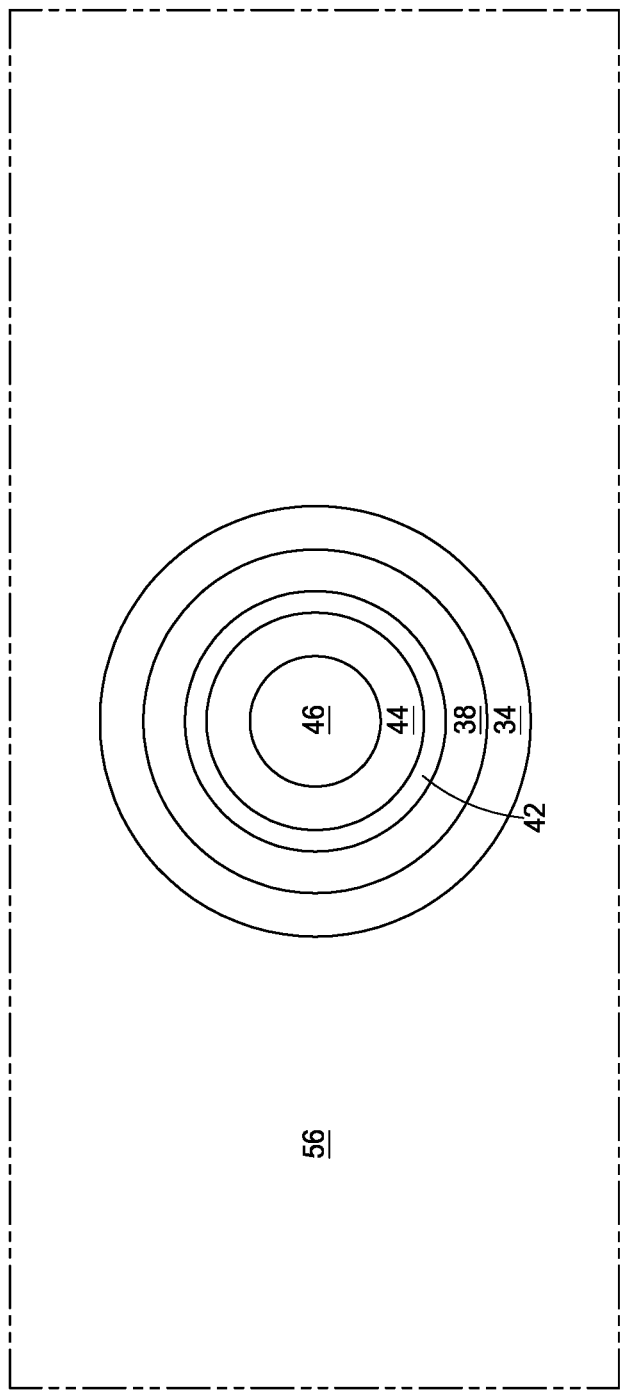
FIG. 19A is a diagrammatic top view of a portion of the integrated assembly of FIG. 19.

FIG. 19A shows a top view of a region of the assembly 10 at the processing stage of FIG. 19, and shows that the various materials 28, 34, 38, 42 and 44 may be configured as annular rings in some example embodiments.

Figure 20:
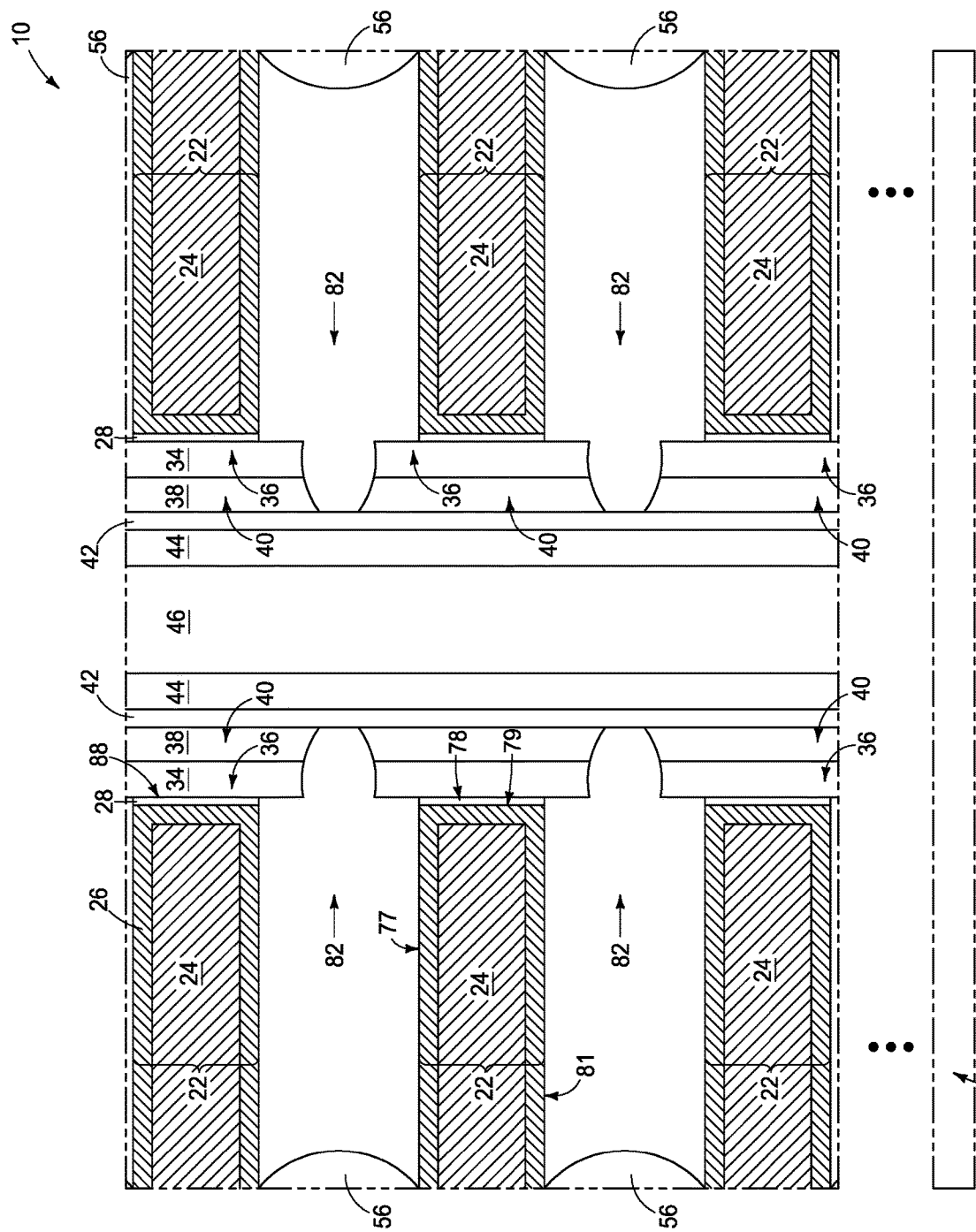
FIG. 20 is a diagrammatic cross-sectional side view of an integrated assembly showing a region of an example NAND memory array.

In the embodiment of FIG. 19, the insulative levels 14 are entirely filled with the insulative material 56. In other embodiments, portions of the voids 82 may remain within the insulative levels 14. For instance, FIG. 20 shows a configuration analogous to that of FIG. 19, but in which the voids 82 are only partially filled with the insulative material 56. Accordingly, portions of the voids 82 remain within the insulative levels 14. The remaining portions of the voids 82 are capped with the insulative material 56. The voids 82 may be filled with air or any other suitable gas.

An advantage of the configuration of FIG. 20 (i.e., a configuration having voids within the insulative levels 14) is that such may alleviate capacitive coupling between vertically-neighboring materials in the event that such capacitive coupling is found to be problematic.

Another example process for fabricating NAND memory cells is described with reference to FIGS. 21-30.

Figure 21:
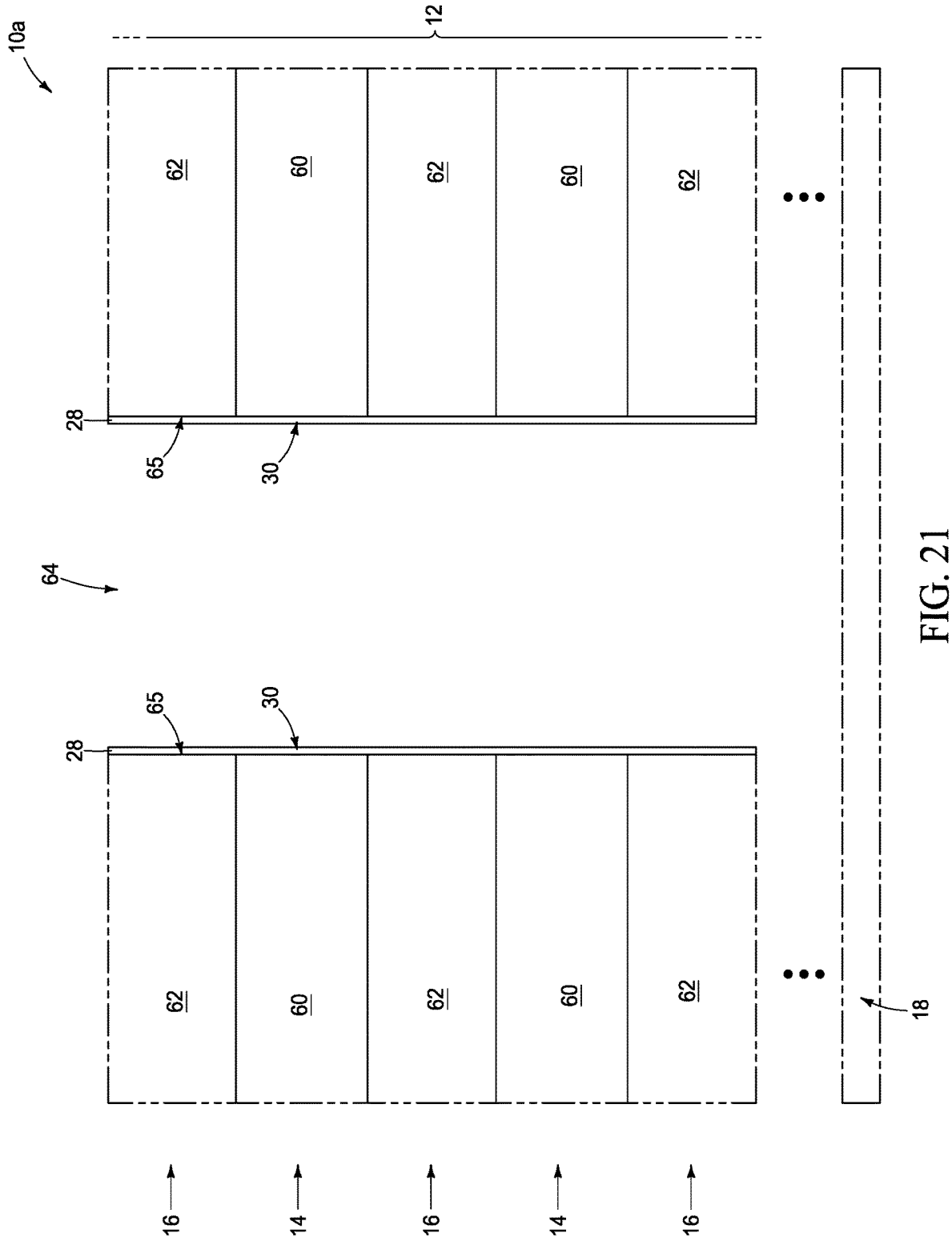
FIGS. 21-30 are diagrammatic cross-sectional side views of a region of an integrated assembly shown at example sequential process stages of an example method for forming an example NAND memory array. The process stage of FIG. 21 may follow that of FIG. 6.

Referring to FIG. 21, a construction (assembly) 10a is shown at a process stage which may follow the process stage of FIG. 6. The high-k dielectric material 28 is formed as a layer 30 along the substantially straight sidewall surface 65 (i.e., along the peripheral sidewall of the opening 64), with the layer 30 extending through the stack 12.

Figure 22:
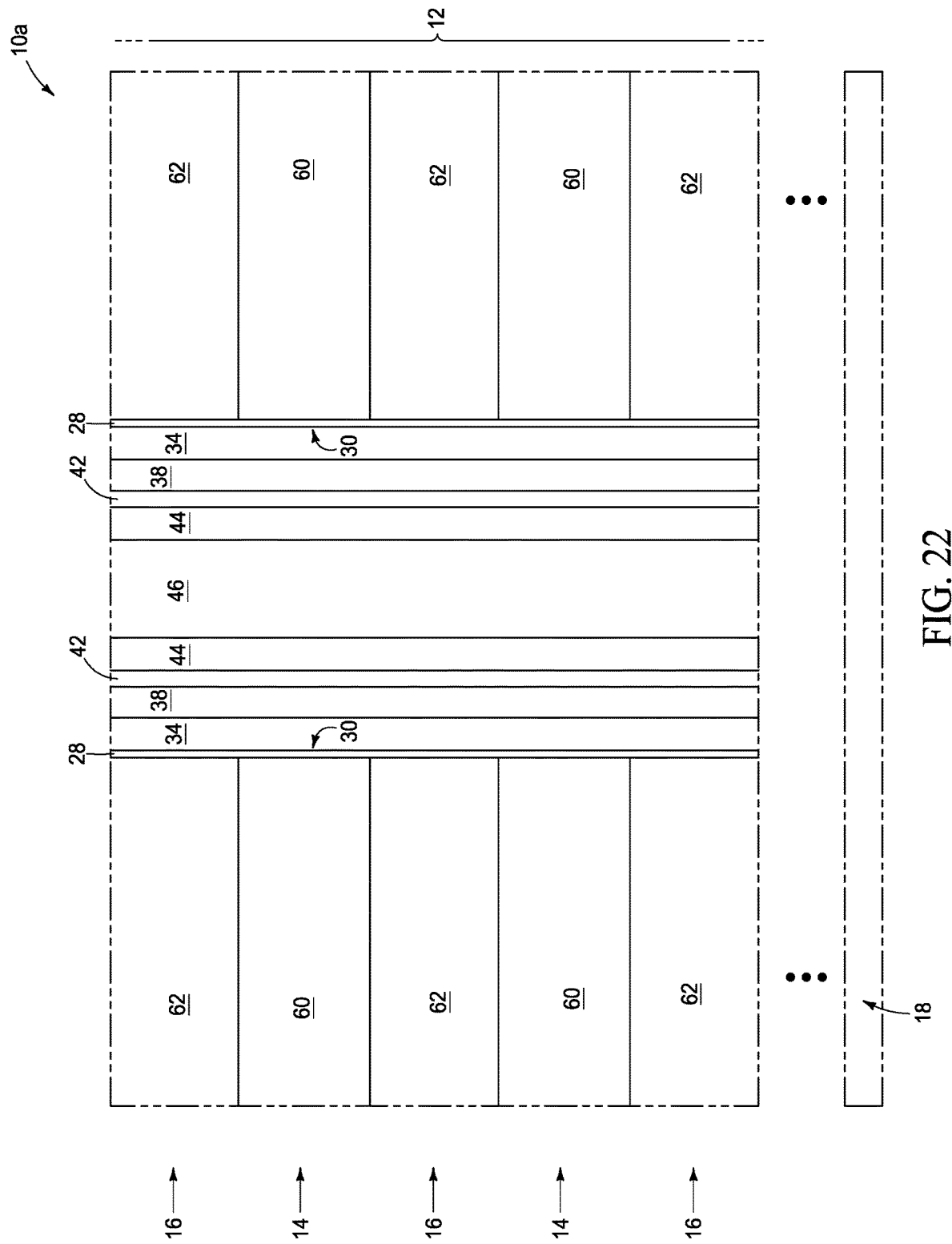

Referring to FIG. 22, the charge-blocking material 34 is formed adjacent the layer 30, the charge-storage material 38 is formed adjacent the charge-blocking material 34, the gate-dielectric material (i.e., tunneling material) 42 is formed adjacent the charge-storage material 38, the channel material 44 is formed adjacent the gate-dielectric material 42, and the insulative material 46 is formed adjacent the channel material 44.

Figure 23:
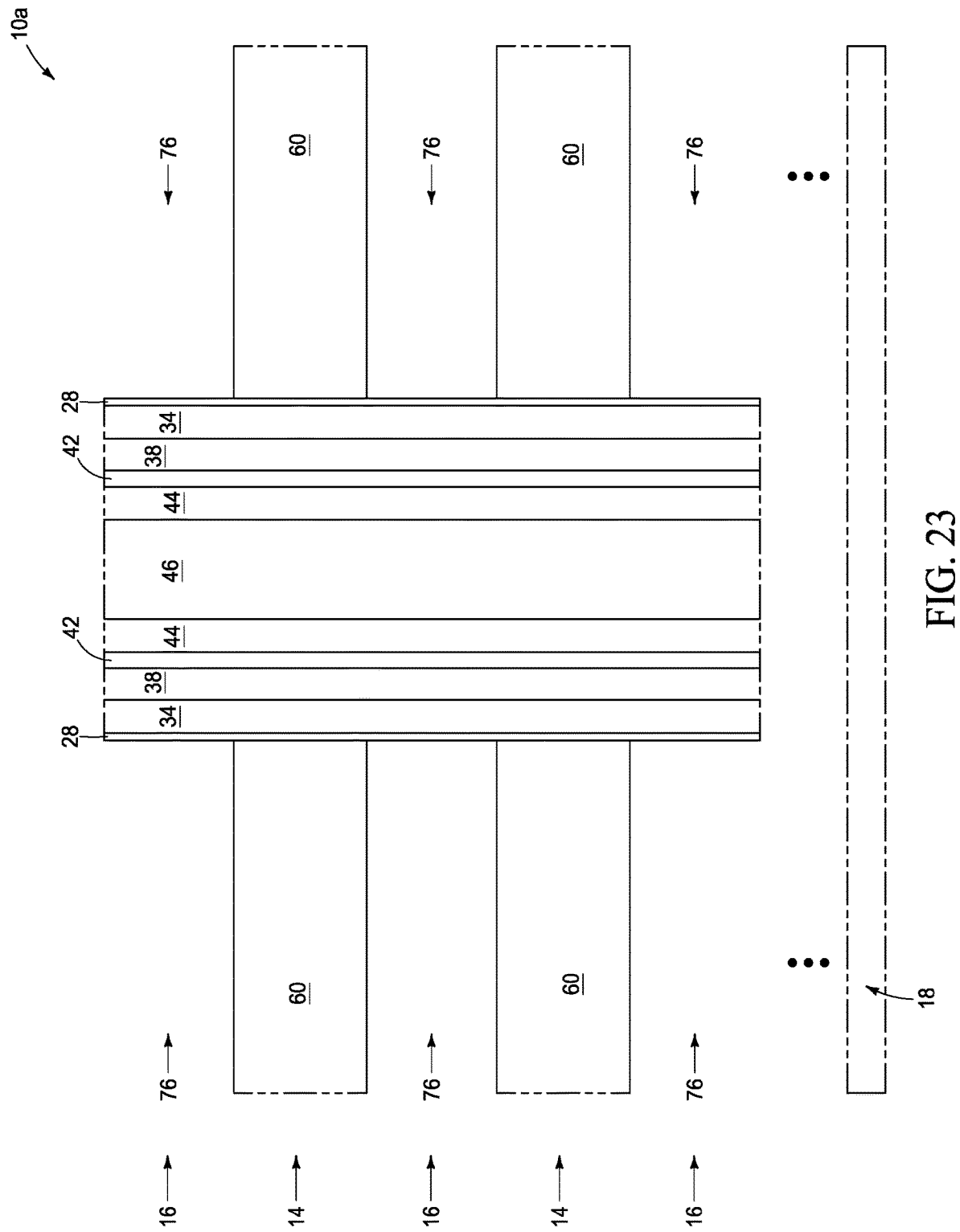

Referring to FIG. 23, the second material 62 (FIG. 22) is removed to leave the voids 76.

Figure 24:
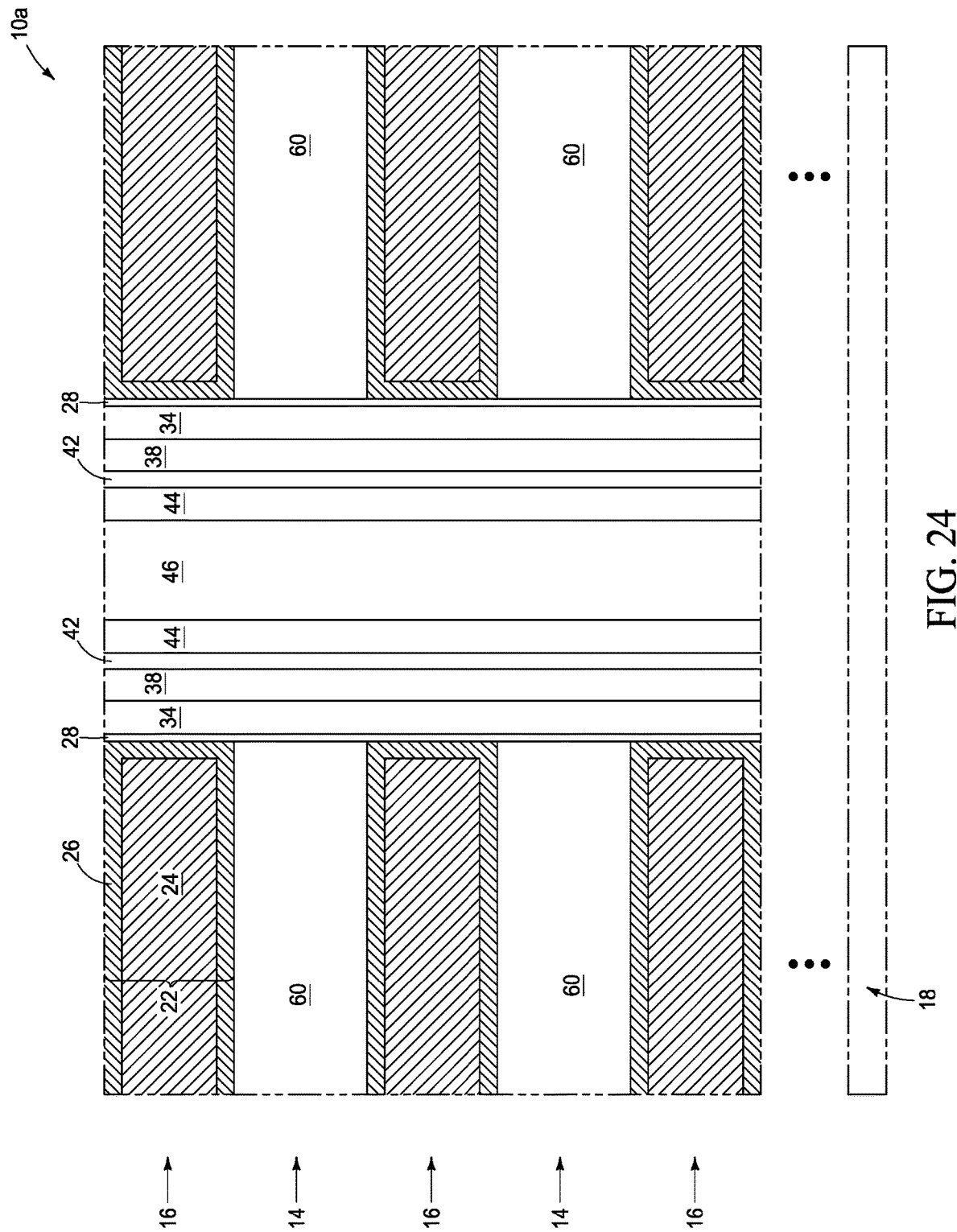

Referring to FIG. 24, the conductive regions 22 are formed within the voids 76 (FIG. 23). The levels 16 may be considered to be conductive levels comprising the conductive regions 22 at the process stage of FIG. 24.

Figure 25:
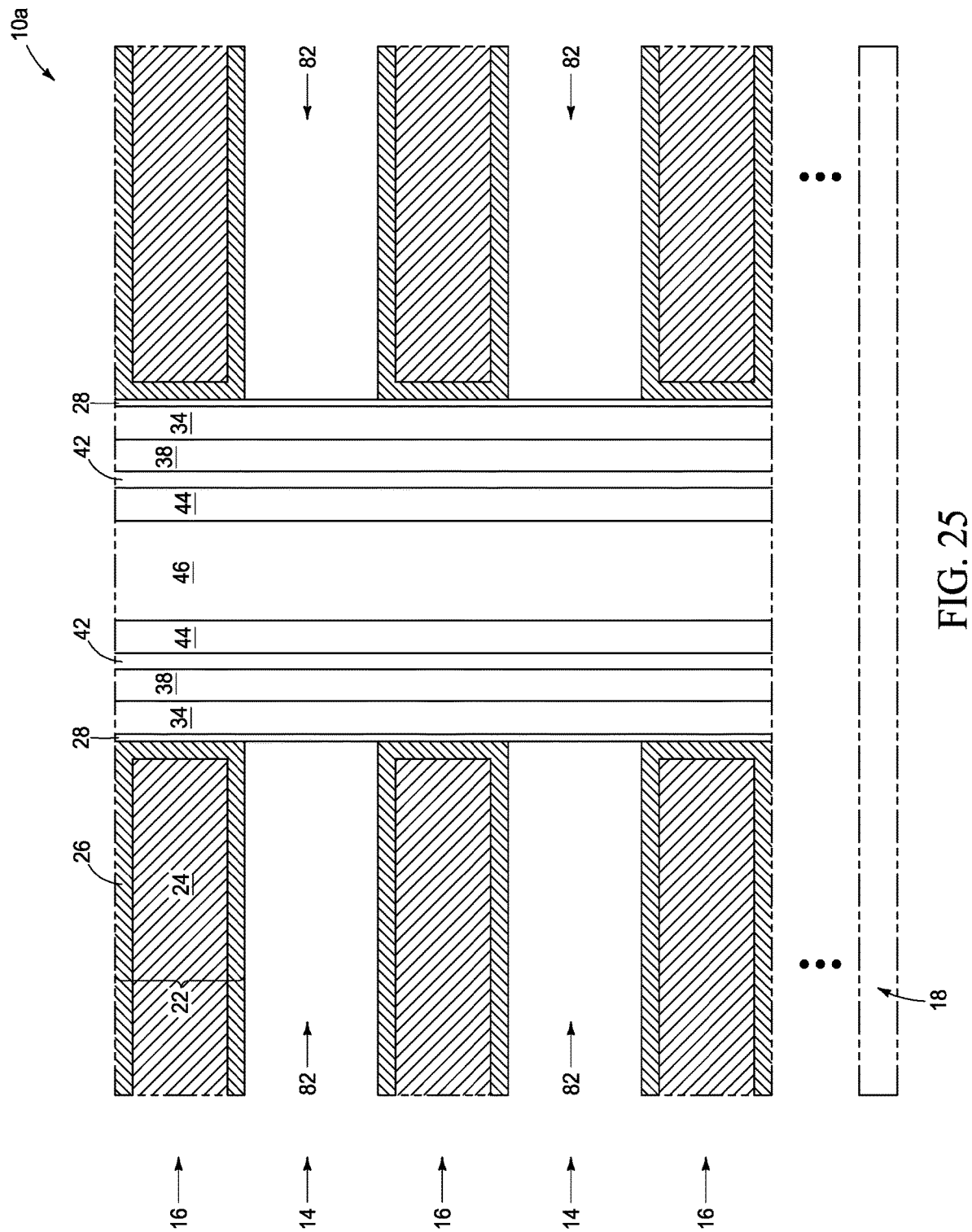

Referring to FIG. 25, the first material 60 (FIG. 24) is removed to form the second voids 82. Regions of the high-k dielectric material are exposed by the second voids 82.

Figure 26:
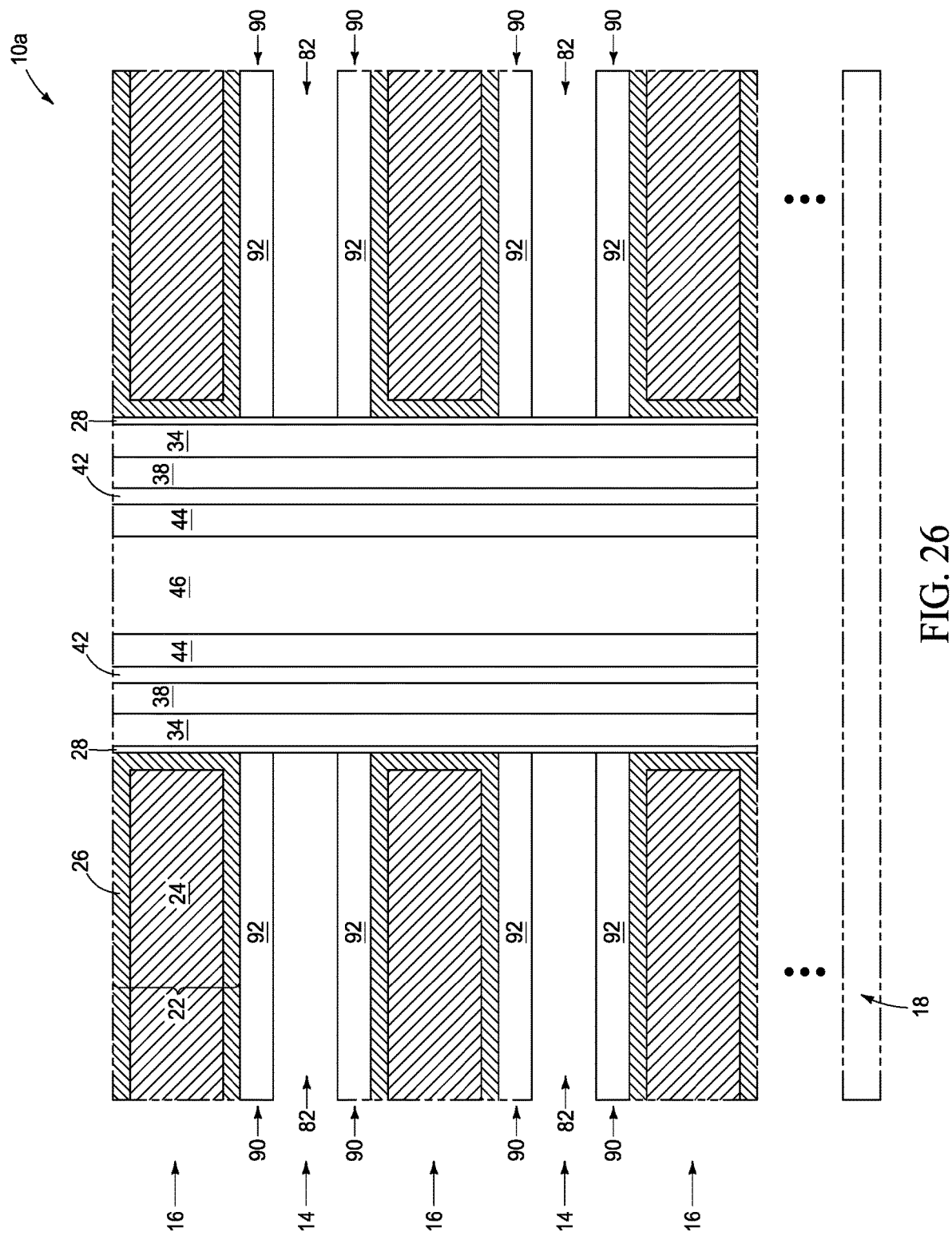

Referring to FIG. 26, the strips 90 are formed within the voids 82 to narrow the voids 82. The narrowing of the voids 82 reduces an amount of the high-k dielectric material 28 exposed by the voids 82.

Figure 27:
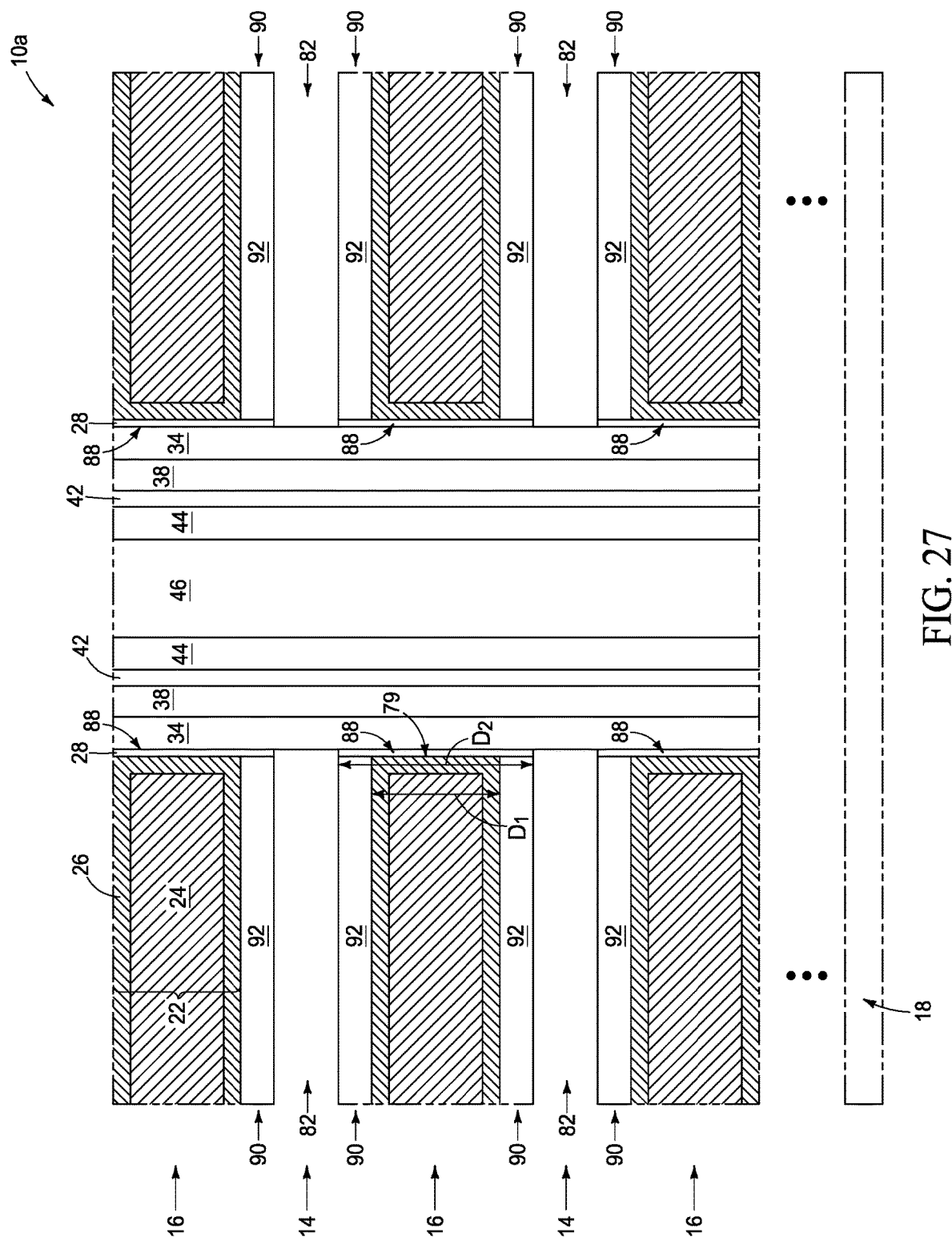

Referring to FIG. 27, the narrowed second voids 82 are extended through the high-k dielectric material 28 to form the vertically-stacked first segments 88 (i.e., the exposed regions of the high-k material 28 are removed to form the segments 88). In the embodiment of FIG. 27, the segments 88 have vertical dimensions $D_2$ which are greater than the vertical dimensions $D_1$ of the front surfaces 79 of the conductive regions 22 (i.e., the front surfaces within the conductive levels 16).

Figure 28:
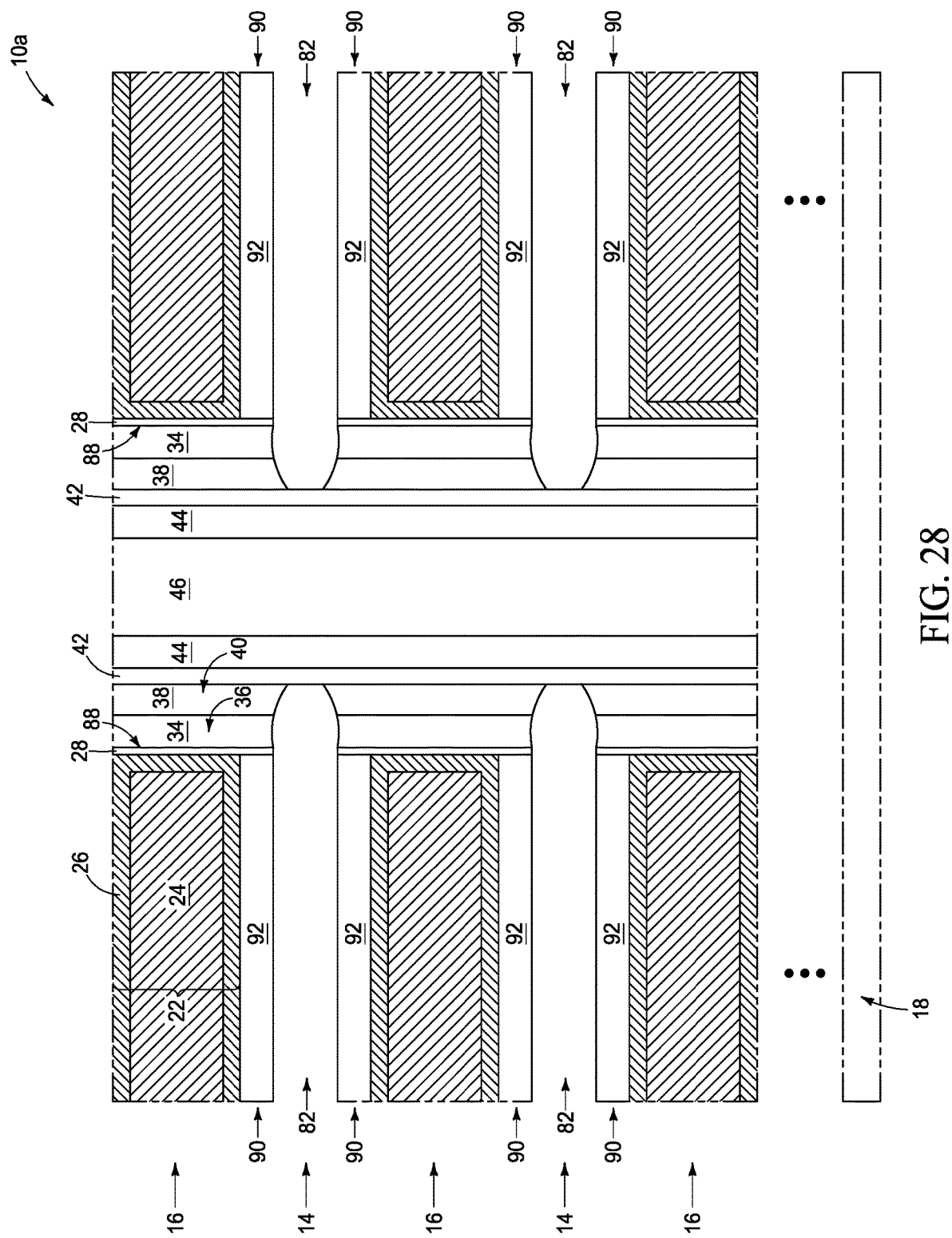

Referring to FIG. 28, the narrowed voids 82 are extended through the charge-blocking material 34, and then are extended through the charge-storage material 38. The extended voids 82 divide the charge-blocking material 34 into the vertically-spaced linear segments 36 and divide the charge-storage material into the vertically-spaced linear segments 40.

The embodiment of FIG. 28 shows the voids 82 extending through the materials 34 and 38, and stopping at the tunneling material 42. In other embodiments, the voids 82 may be extended through the tunneling material.

Figure 29:
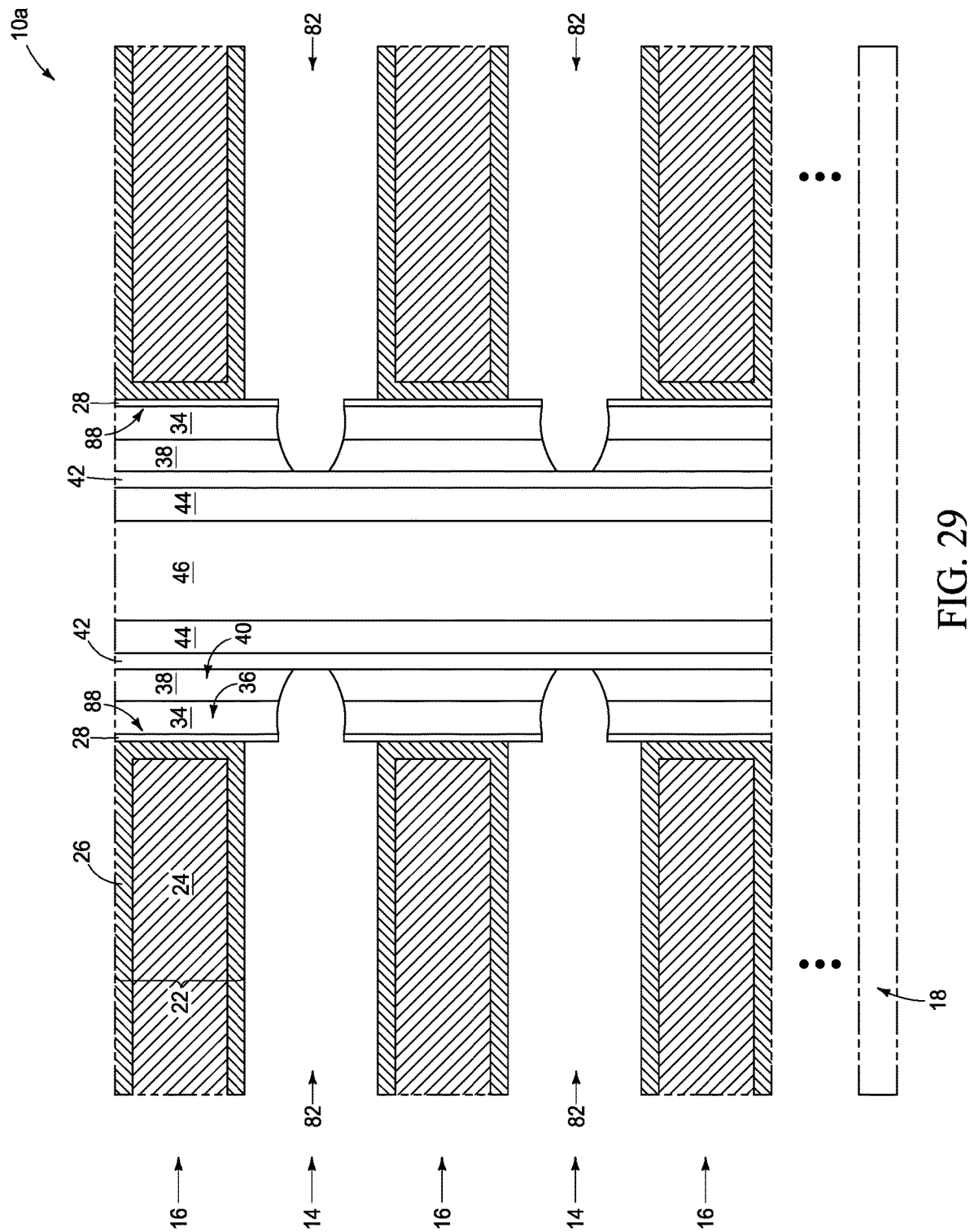

Referring to FIG. 29, the strips 90 (FIG. 28) are removed.

Figure 30:
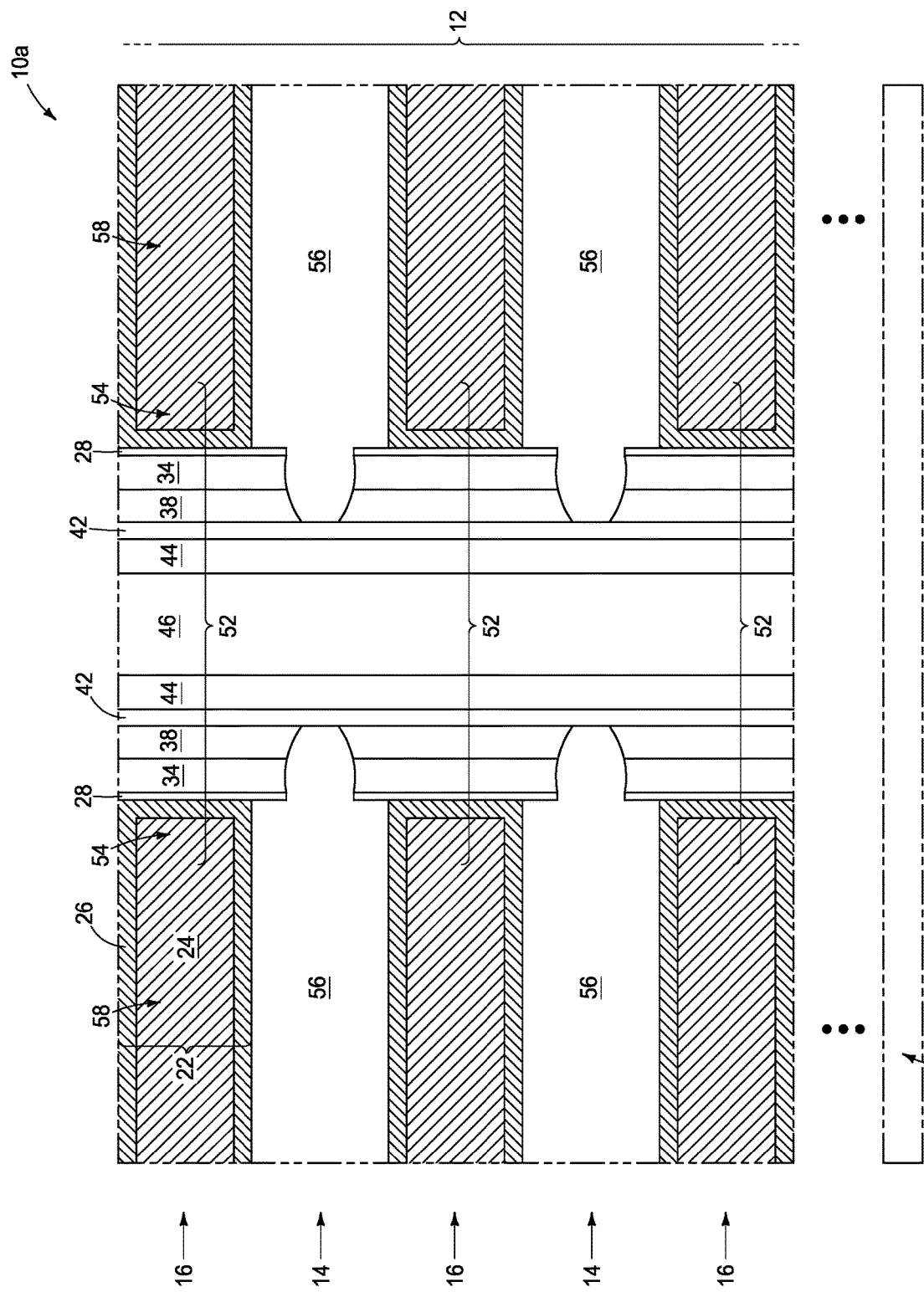

Referring to FIG. 30, the insulative material 56 is formed within the second voids 82 (FIG. 29). The assembly 10a of FIG. 30 comprises NAND memory cells 52 analogous to those described above with reference to FIG. 19.

Although the voids 82 (FIG. 29) are shown to be entirely filled with the insulative material 56 at the process stage of FIG. 30, in other embodiments the voids may be only partially filled to form configurations analogous to that described above with reference to FIG. 20.

Another example process for fabricating NAND memory cells is described with reference to FIGS. 31-41.

Figure 31:
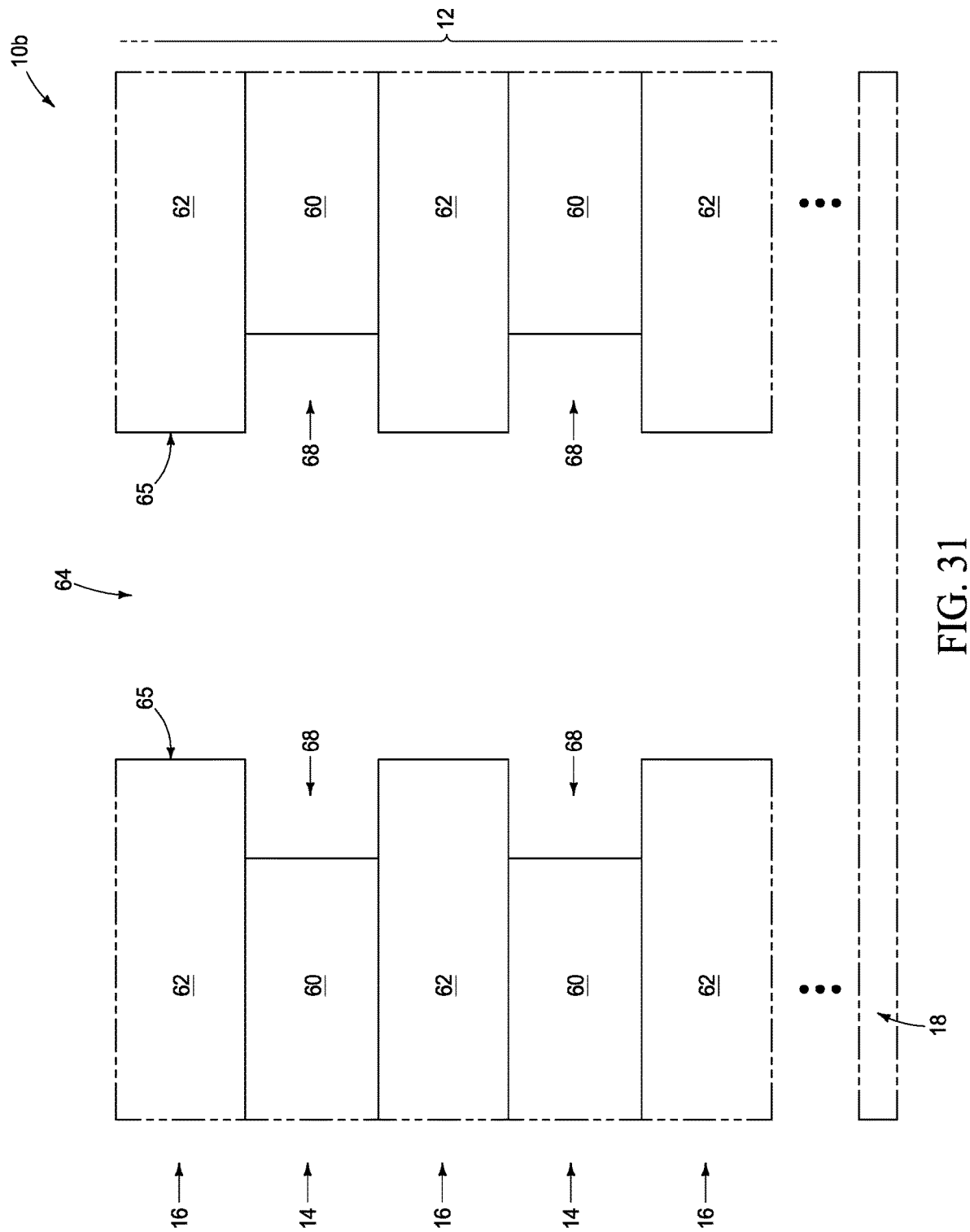
FIGS. 31-40 are diagrammatic cross-sectional side views of a region of an integrated assembly shown at example sequential process stages of an example method for forming an example NAND memory array. The process stage of FIG. 31 is identical to that of FIG. 7.

Referring to FIG. 31, a construction (assembly) 10b is shown at a process stage which may be identical to the process stage of FIG. 7. The construction includes the opening 64 extending through the stack 12, and having the undulating peripheral sidewall surface 65. The cavities 68 extend into regions of the peripheral surface 65.

Figure 32:
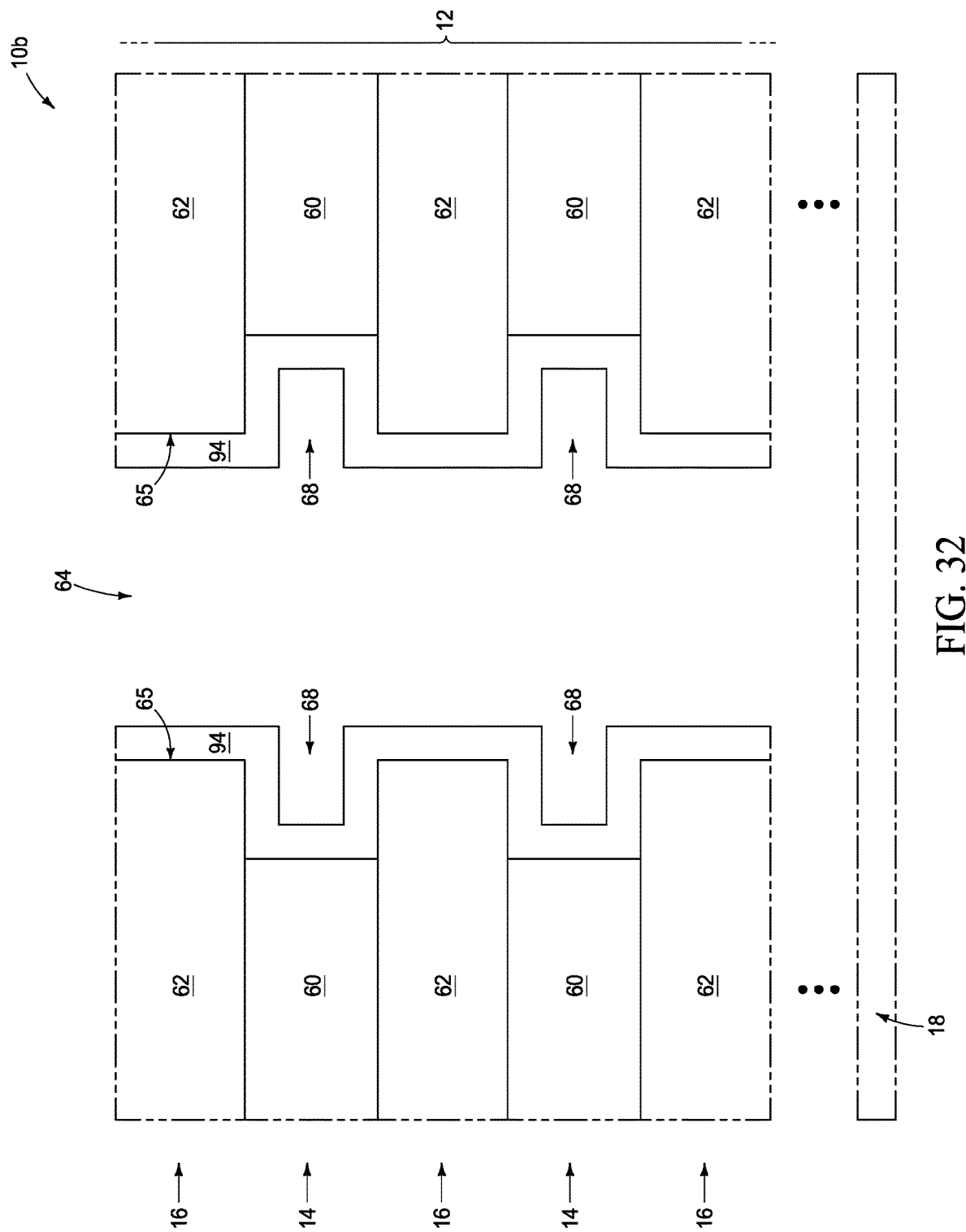

Referring to FIG. 32, a layer of a material 94 is formed along the undulating surface 65. The material 94 may comprise any suitable composition(s); and in some embodiments may comprise, consist essentially of, or consist of silicon.

Figure 33:
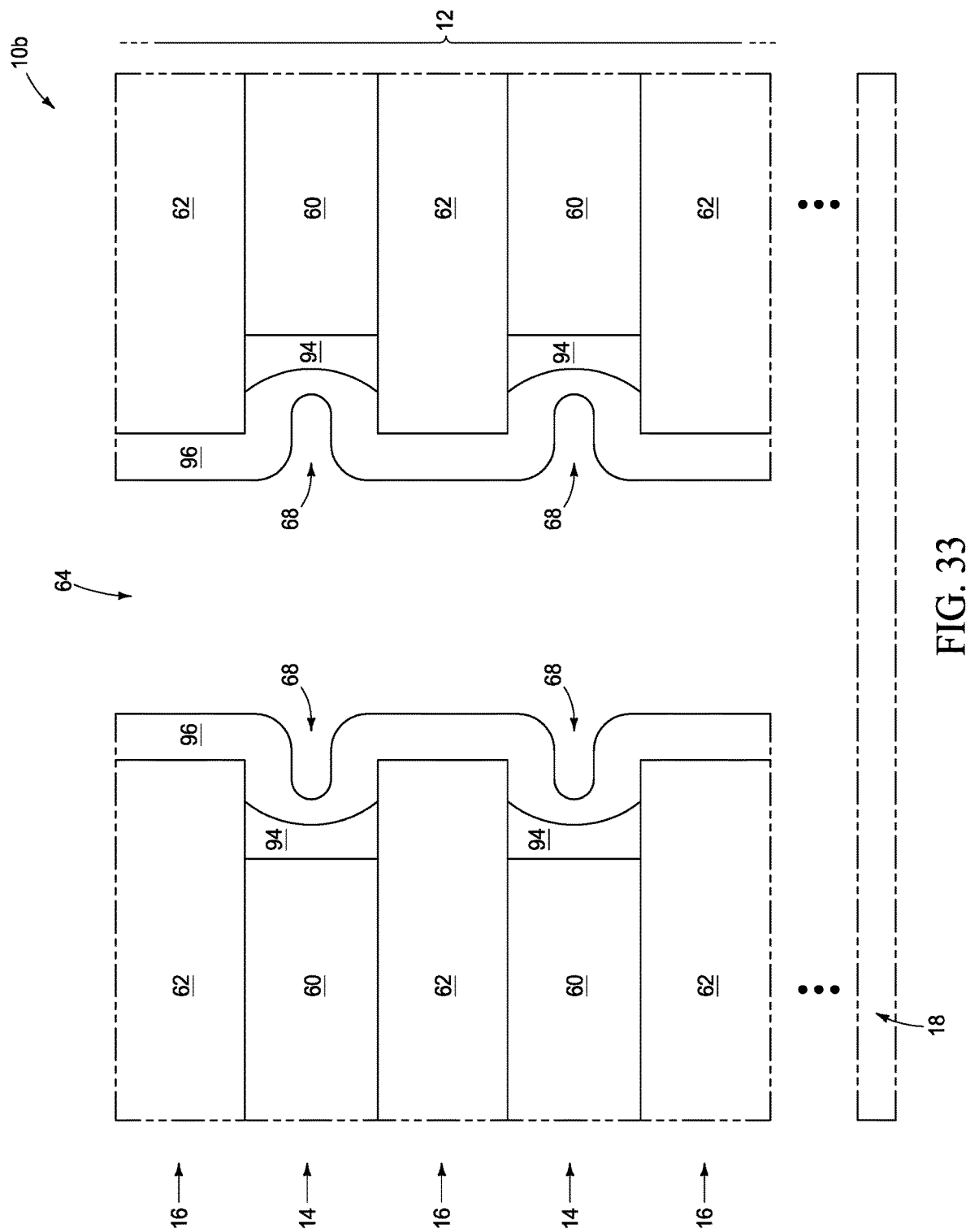

Referring to FIG. 33, the material 94 is partially oxidized to form an oxide 96 (e.g., silicon dioxide) laterally outward of the remaining material 94. The remaining material 94 is within the cavities 68.

Figure 34:
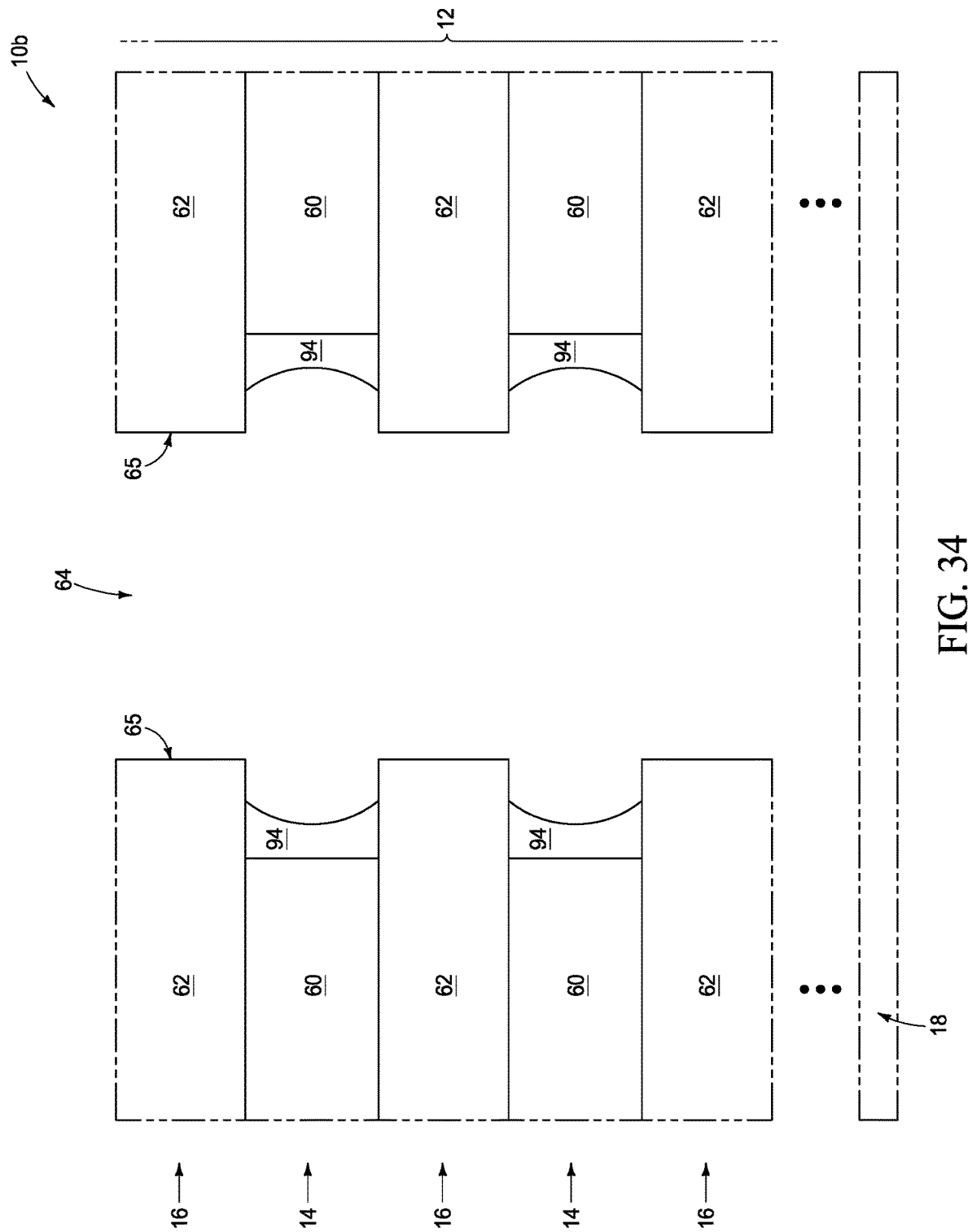

Referring to FIG. 34, the oxide 96 (FIG. 33) is removed. After the oxide is removed, the peripheral sidewall 65 of the opening 64 has an undulating surface that extends along the second material 62 and along the remaining material 94. In some embodiments, the undulating sidewall of the opening 64 at the process stage of FIG. 34 may be referred to as a second undulating sidewall to distinguish it from the first undulating sidewall shown at the process stage of FIG. 31.

Figure 35:
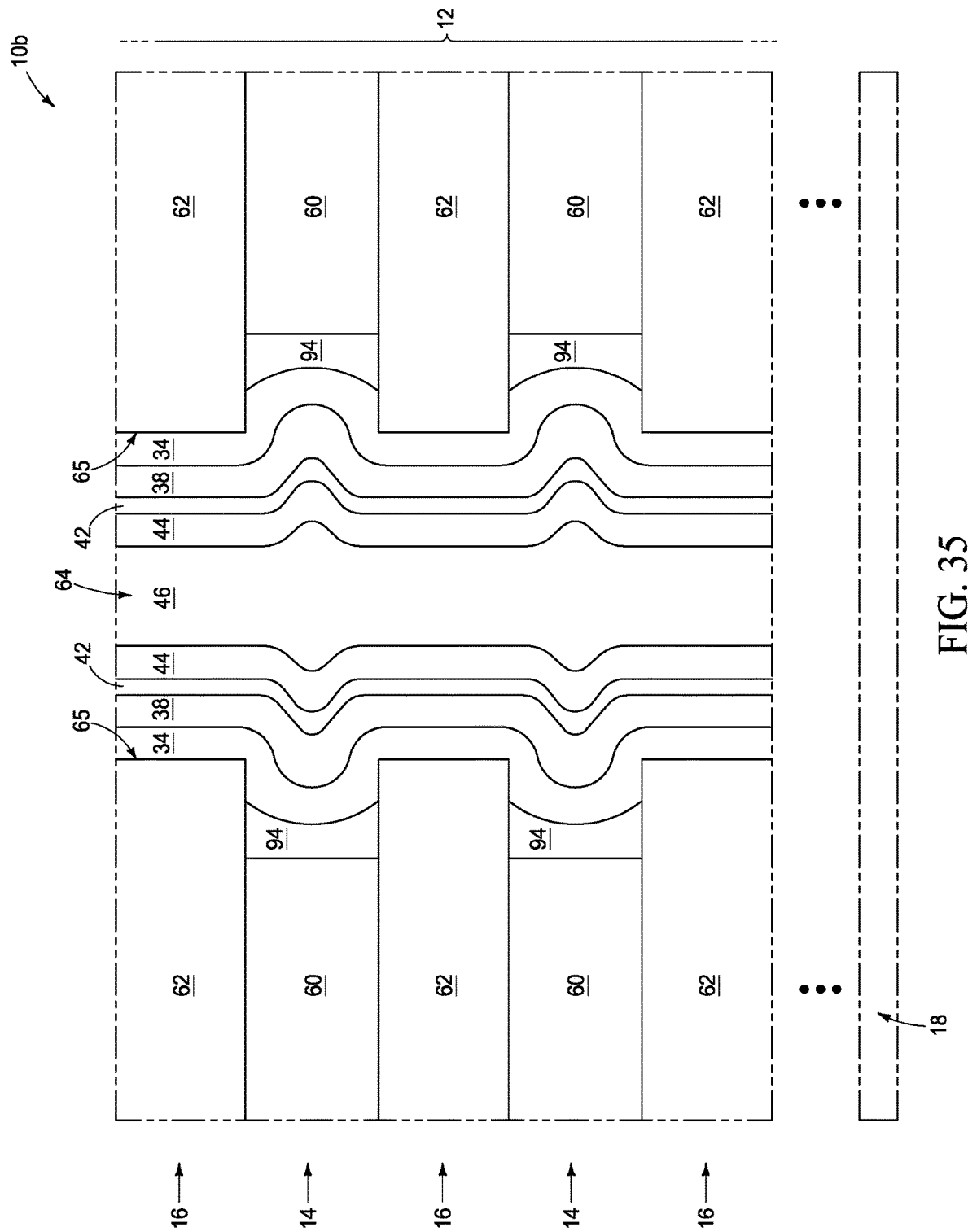

Referring to FIG. 35, the charge-blocking material 34 is formed along the undulating surface 65, the charge-storage material 38 is formed adjacent the charge-blocking material 34, the gate-dielectric material (i.e., tunneling material) 42 is formed adjacent the charge-storage material 38, the channel material 44 is formed adjacent the gate-dielectric material 42, and the insulative material 46 is formed adjacent the channel material 44. The materials 34, 38, 42 and 44 are all configured as vertically-extending layers which have undulating topographies substantially conformal to the undulating topography of the peripheral sidewall 65 of the opening 64.

Figure 36:
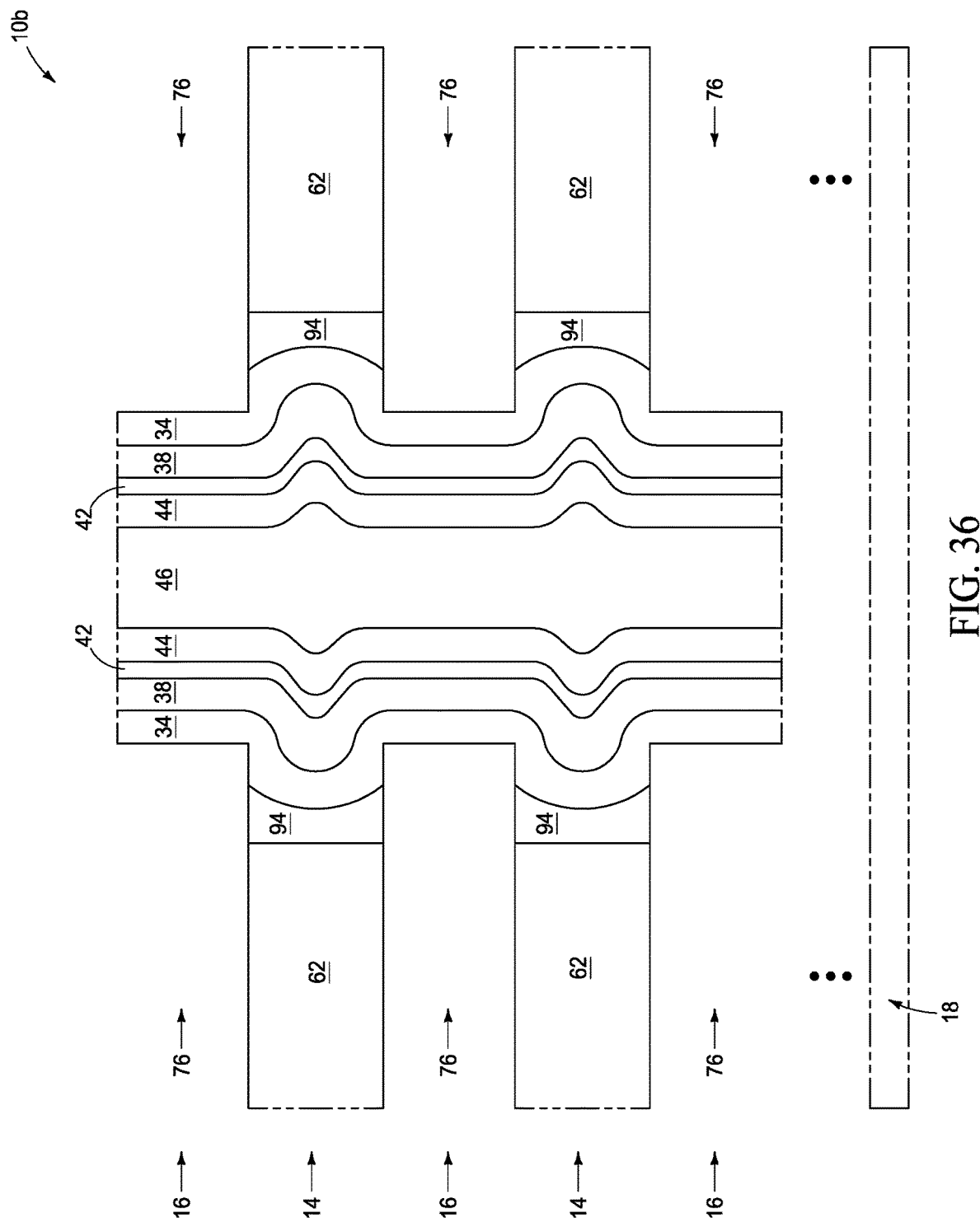

Referring to FIG. 36, the second material 62 (FIG. 35) is removed to form the voids 76.

Figure 37:
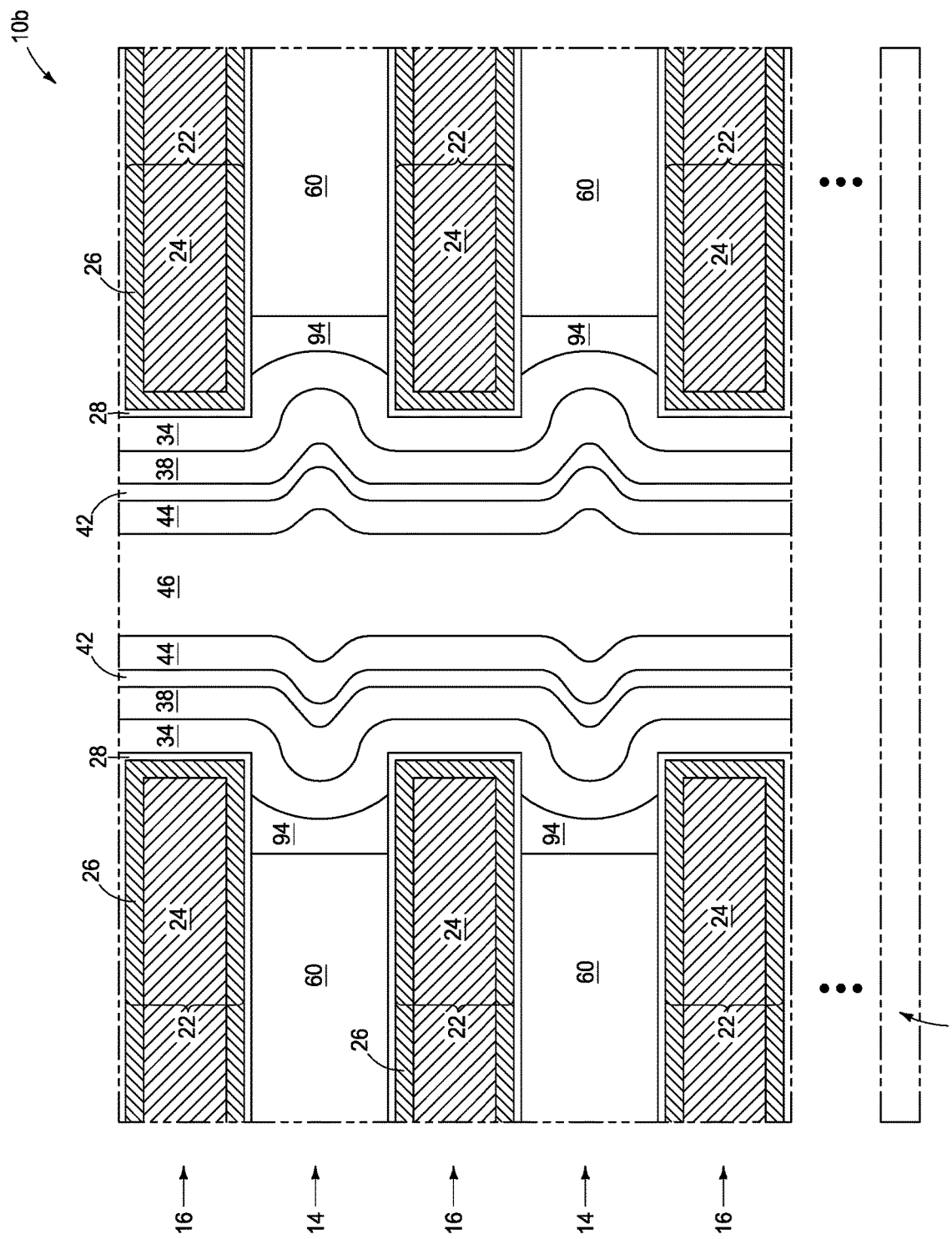

Referring to FIG. 37, the high-k dielectric material 28 is formed within the voids 76 (FIG. 36) to line the voids; and the conductive regions 22 are formed within the lined voids 76. The levels 16 of FIG. 37 may be referred to as conductive levels.

Figure 38:
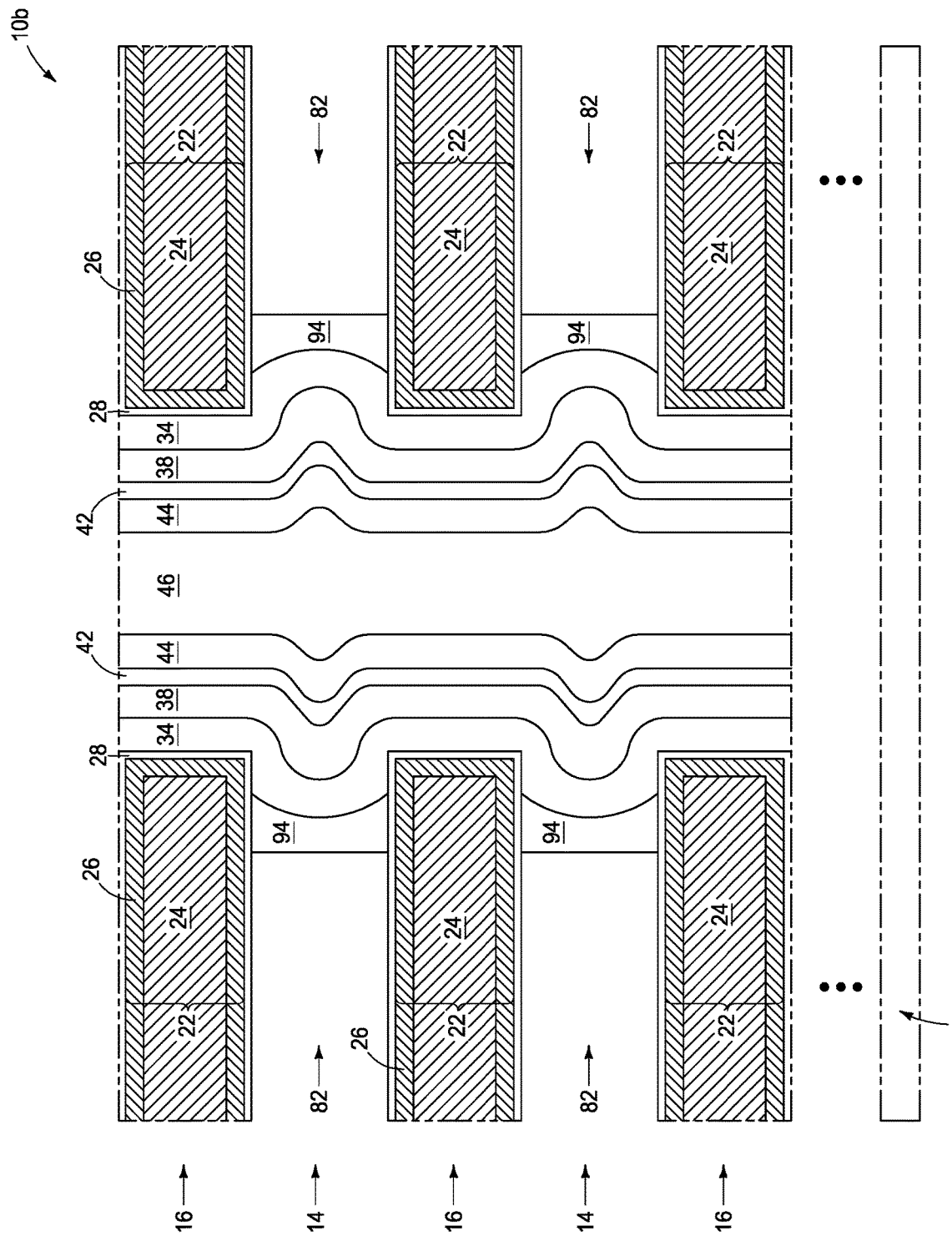

Referring to FIG. 38, the first material 60 (FIG. 37) is removed to form the second voids 82. The material 94 is exposed within the second voids 82.

Figure 39:
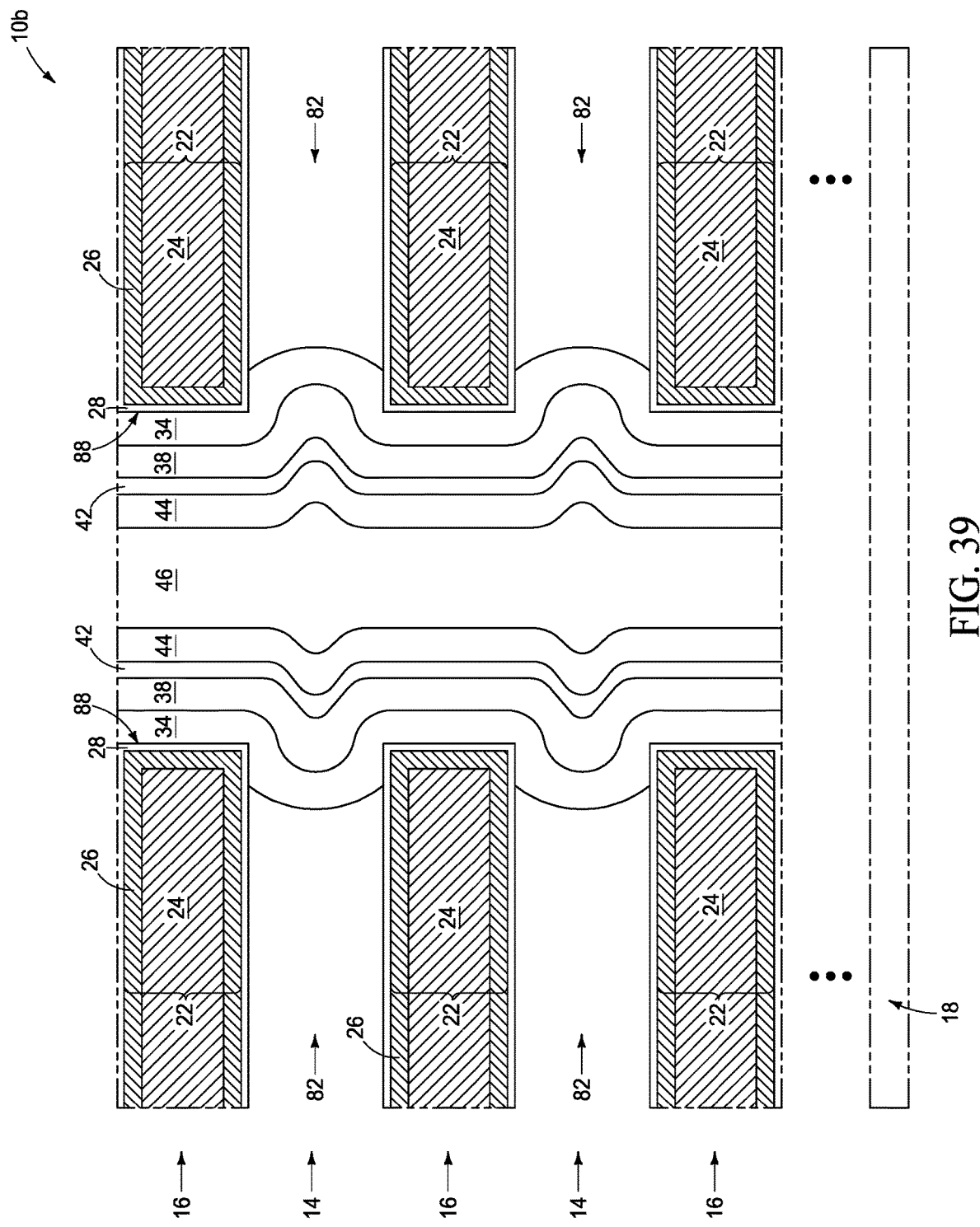

Referring to FIG. 39, the material 94 (FIG. 38) is removed to extend the voids 82.

Figure 40:
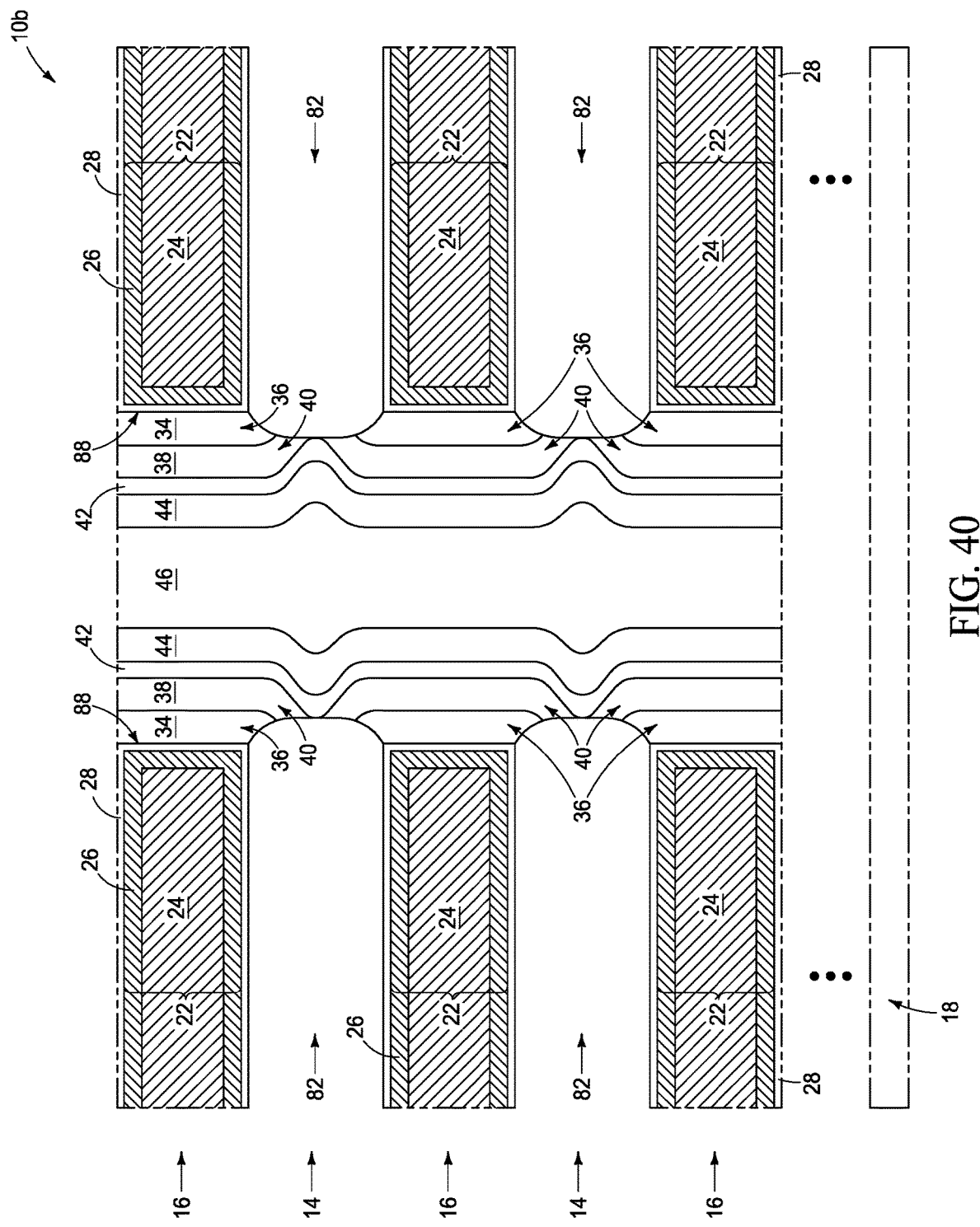

Referring to FIG. 40, the voids 82 are extended through the charge-blocking material 34, and then are extended through the charge-storage material 38. The extended voids 82 divide the charge-blocking material 34 into the vertically-spaced linear segments 36, and divide the charge-storage material into the vertically-spaced linear segments 40.

Figure 40A:
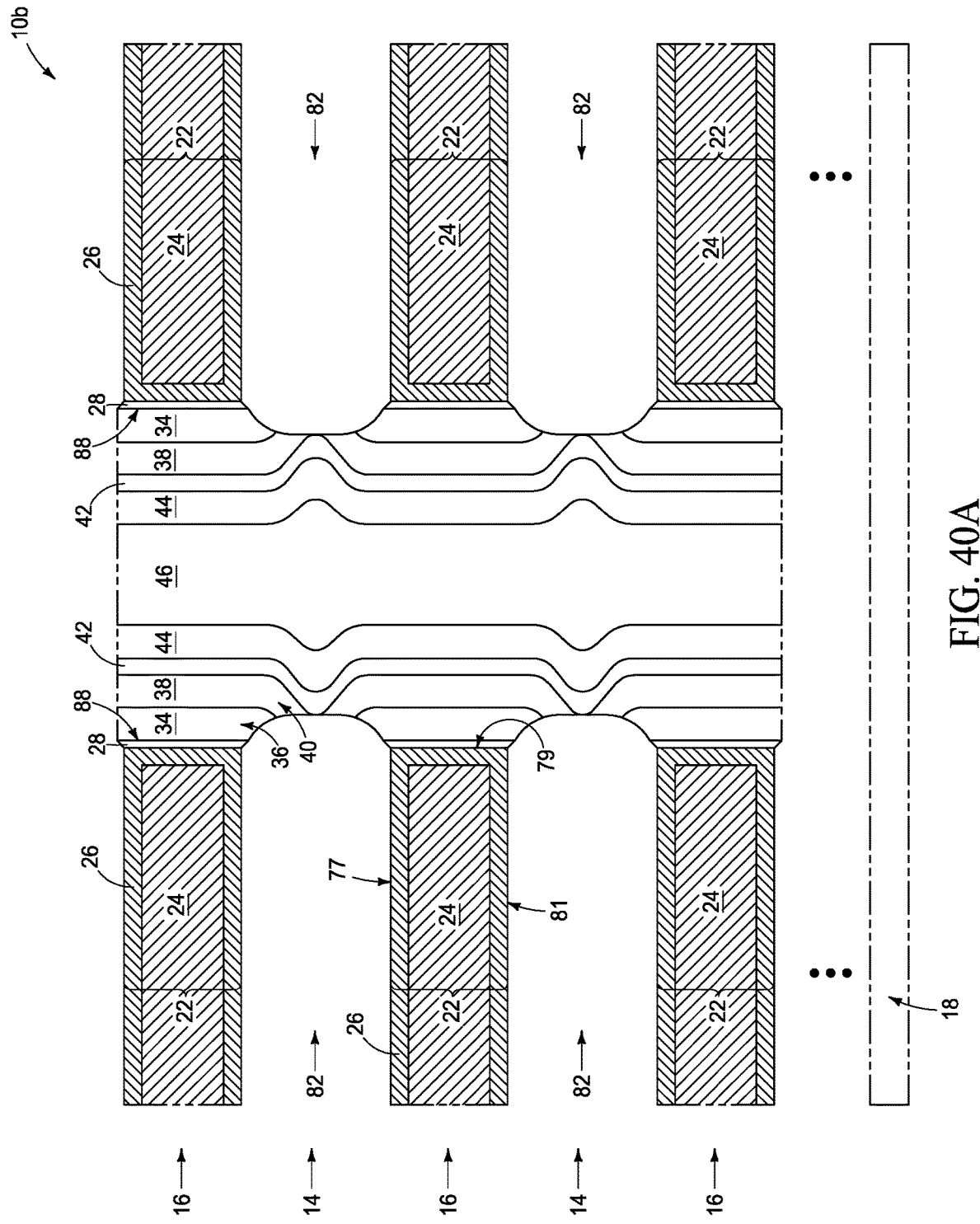
FIG. 40A is a diagrammatic cross-sectional side view of an integrated assembly showing a region of an example NAND memory array at a process which may follow that of FIG. 40 in some embodiments.

FIG. 40A shows a process stage which may be alternative to that of FIG. 40. Exposed portions of the high-k dielectric material 28 are removed from along the upper and lower surfaces 77 and 81 of the conductive regions 22 with processing analogous to that described above with reference to FIG. 15 to form the high-k dielectric material 28 into the vertically-extending linear segments 88.

Figure 41:
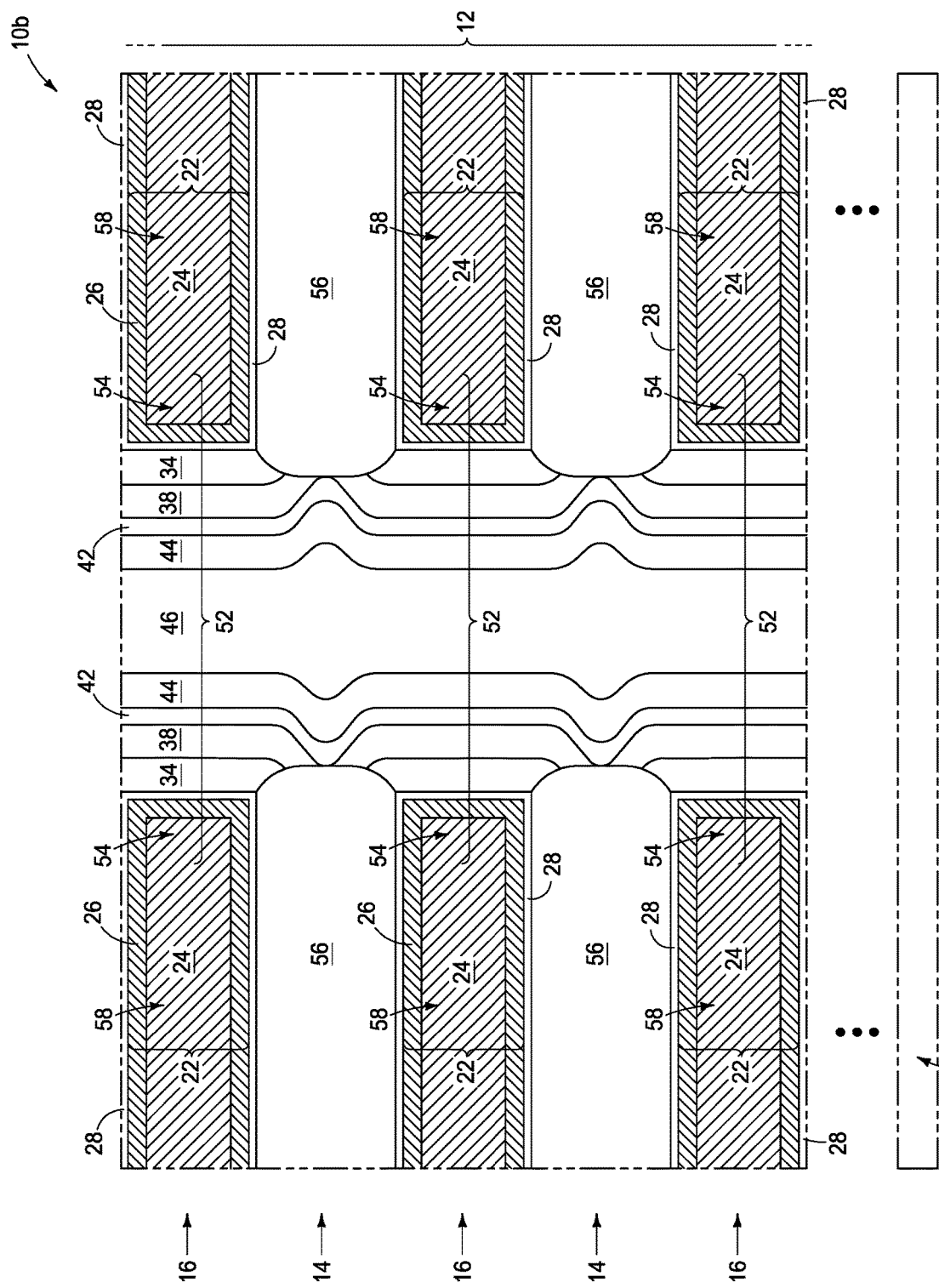
FIG. 41 is a diagrammatic cross-sectional side view of an integrated assembly showing a region of an example NAND memory array at a process which may follow that of FIG. 40.

Referring to FIG. 41, the construction 10b is shown at a process stage subsequent to that of FIG. 40. The insulative material 56 is formed within the voids 82 (FIG. 40). The assembly 10b of FIG. 41 comprises NAND memory cells 52 analogous to those described above with reference to FIG. 19.

Although the voids 82 (FIG. 40) are shown to be entirely filled with the insulative material 56 at the process stage of FIG. 41, in other embodiments the voids may be only partially filled to form configurations analogous to that described above with reference to FIG. 20.

Figure 41A:
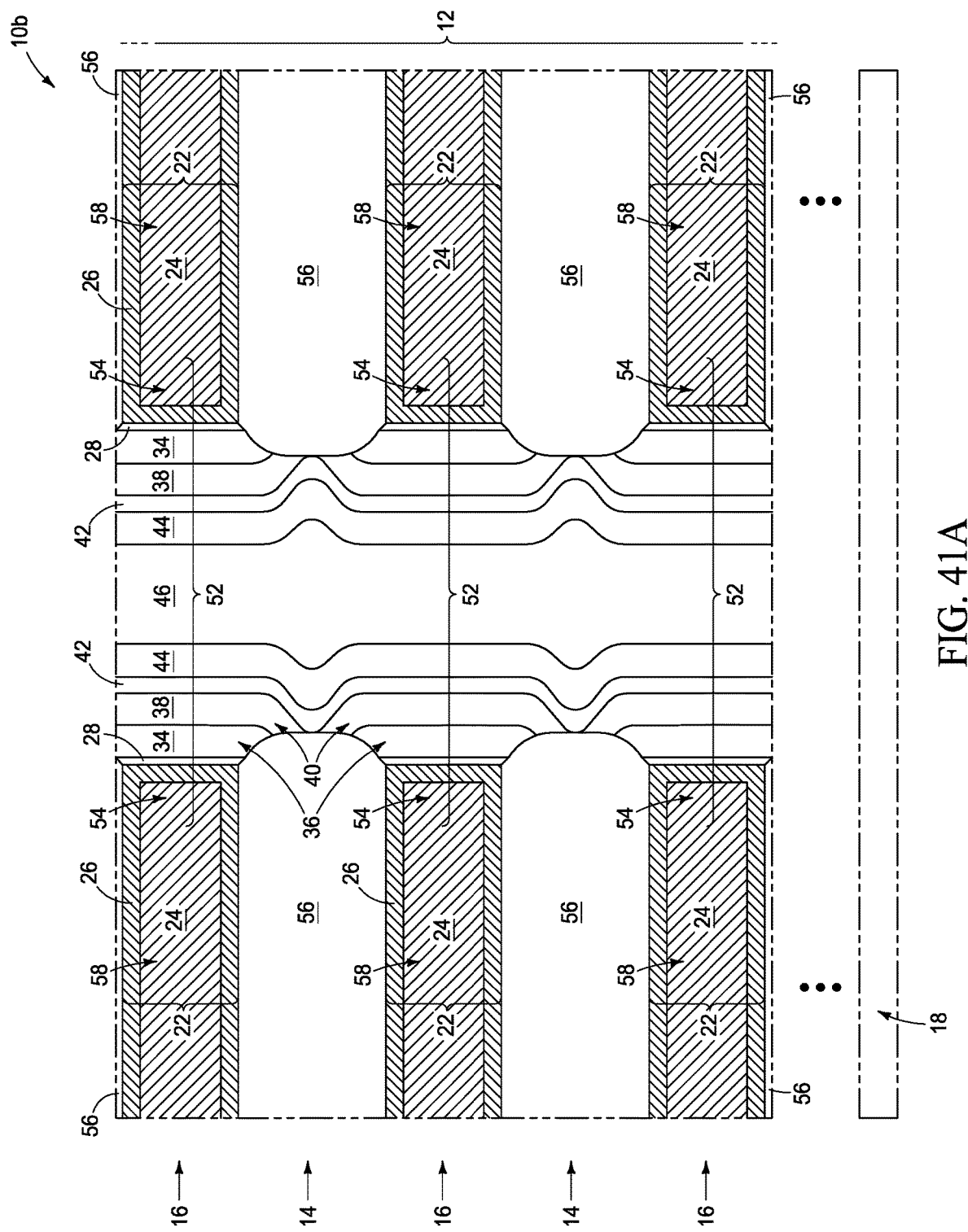
FIG. 41A is a diagrammatic cross-sectional side view of an integrated assembly showing a region of an example NAND memory array at a process which may follow that of FIG. 40A.

Referring to FIG. 41A, the construction 10b is shown at a process stage subsequent to that of FIG. 40A. The insulative material 56 is formed within the voids 82 (FIG. 40A). The assembly 10b of FIG. 41A comprises NAND memory cells 52 analogous to those described above with reference to FIG. 19. The segments 40 of the charge-storage material 38 have rounded configurations at the process stage of FIG. 41, in contrast to the substantially flat configurations of such segments at the above-discussed process stage of FIG. 19.

Although the voids 82 (FIG. 40A) are shown to be entirely filled with the insulative material 56 at the process stage of FIG. 41A, in other embodiments the voids may be only partially filled to form configurations analogous to that described above with reference to FIG. 20.

In operation, the charge-storage material 38 may be configured to store information in the memory cells 52 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 54, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 may provide a mechanism to block charge from flowing from the charge-storage material 38 to the associated gates 54.

The dielectric-barrier material (high-k material) 28 may be utilized to inhibit back-tunneling of charge carriers from the gates 54 toward the charge-storage material 38. In some embodiments, the dielectric-barrier material 28 may be considered to form dielectric-barrier regions within the memory cells 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. Channel material extends vertically through the stack. The conductive levels have front surfaces facing the channel material, and have upper and lower surfaces extending back from the front surfaces. High-k dielectric material is arranged in vertically-stacked first segments. The high-k dielectric material is along the front surfaces of the conductive levels and is not along the upper and lower surfaces of the conductive levels. Charge-blocking material is arranged in vertically-stacked second segments. The second segments are adjacent the first segments. Charge-storage material is arranged in vertically-stacked third segments. The third segments are adjacent the second segments. Gate-dielectric material is adjacent the charge-storage material, and is between the charge-storage material and the channel material.

Some embodiments include a NAND memory array having a vertical stack of alternating insulative levels and conductive levels. The conductive levels include control gate regions. High-k dielectric material is adjacent to the control gate regions and is configured as an arrangement of first vertically-extending linear segments which are vertically spaced from one another. Charge-blocking material is adjacent to the high-k dielectric material and is configured as an arrangement of second vertically-extending linear segments which are vertically spaced from one another. Charge-storage material is adjacent to the charge-blocking material and is configured as an arrangement of third vertically-extending linear segments which are vertically spaced from one another. Gate-dielectric material is adjacent to the charge-storage material. Channel material extends vertically along the stack and is adjacent to the gate-dielectric material.

Some embodiments include a method of forming an integrated structure. A vertical stack is formed to include alternating first and second levels. The first levels comprise first material and the second levels comprise second material. An opening is formed to extend through the stack. The opening has a peripheral sidewall. Charge-blocking material is formed adjacent to the peripheral sidewall. Charge-storage material is formed adjacent to the charge-blocking material. Gate-dielectric material is formed adjacent to the charge-storage material. Channel material is formed adjacent to the gate-dielectric material. The second material is removed to leave first voids. Conductive levels are formed within the first voids. The conductive levels have front ends with front surfaces. The front surfaces face the charge blocking material. High-k dielectric material is formed to be between the front surfaces and the charge-blocking material. The high-k dielectric material is configured as first segments which are vertically-spaced from one another, with the first segments being along the front surfaces of the conductive levels and not wrapping around the front ends of the conductive levels. The first material is removed to leave second voids. The second voids are extended through the charge-storage material to divide the charge-storage material into vertically-spaced segments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
   forming a vertical stack of alternating first and second levels; the first levels comprising first material and the second levels comprising second material;
   forming an opening to extend through the stack, the opening having a peripheral sidewall;
   forming charge-blocking material adjacent the peripheral sidewall;
   forming charge-storage material adjacent the charge-blocking material;
   forming gate-dielectric material adjacent the charge-storage material;
   forming channel material adjacent the gate-dielectric material;
   removing the second material to leave first voids;
   forming conductive levels within the first voids; the conductive levels having front ends with front surfaces; the front surfaces facing the charge blocking material;
   after the forming of the charge-blocking material, forming high-k dielectric material to be between said front surfaces and the charge-blocking material; the high-k dielectric material being configured as first segments which are vertically-spaced from one another, with said first segments being along the front surfaces of the conductive levels and not wrapping around the front ends of the conductive levels;
   removing the first material to leave second voids; and
   extending the second voids through the charge-storage material to divide the charge-storage material into vertically-spaced segments.

2. The method of claim 1 further comprising forming the high-k dielectric material within the first voids to line the first voids; wherein the forming of the conductive levels comprises forming conductive material within the lined first voids; wherein the forming of the second voids exposes portions of the high-k dielectric material above and below the conductive material; wherein the second voids have a vertical thickness; and further comprising the following steps in the following order;
   removing the exposed portions of the high-k dielectric material;
   forming strips within the second voids to narrow said vertical thickness;
   extending the second voids through the charge-blocking material and then through the charge-storage material to divide the charge-storage material into the vertically-spaced segments; and
   at least partially filling the second voids with insulative material.

3. The method of claim 1 further comprising forming the high-k dielectric material within the first voids to line the first voids; wherein the forming of the conductive levels comprises forming conductive material within the lined first voids; wherein the forming of the second voids exposes portions of the high-k dielectric material above and below the conductive material; wherein the second voids have a vertical thickness; and further comprising;
   removing the exposed portions of the high-k dielectric material;
   forming sacrificial material within the second voids to narrow said vertical thickness;
   after the vertical thickness is narrowed, extending the second voids through the charge-blocking material and then through the charge-storage material to divide the charge-storage material into the vertically-spaced segments;
   removing the sacrificial material; and
   after removing the sacrificial material, at least partially filling the second voids with insulative material.

4. The method of claim 3 wherein the sacrificial material comprises silicon nitride.

5. The method of claim 1 further comprising:
   recessing the first levels relative to the second levels to form cavities along the first levels;
   filling the cavities with sacrificial material to form the peripheral sidewall of the opening to have a substantially straight sidewall surface; the forming of the charge-blocking material comprising forming the charge-blocking material along the substantially straight sidewall surface; and
   removing the sacrificial material during the forming of the second voids.

6. The method of claim 5 wherein the charge-blocking material has a substantially flat topography along the substantially straight sidewall surface; wherein the charge-storage material is formed along the substantially flat topography; and wherein each of the vertically-spaced segments of the charge-storage material has a substantially flat configuration.

7. The method of claim 5 wherein the sacrificial material comprises polycrystalline silicon.

8. The method of claim 1 wherein:
   the high-k dielectric material is initially formed as a layer extending vertically through the stack;
   the removing of the first material exposes regions of the high-k dielectric material; and
   at least portions of said regions are removed.

9. The method of claim 8 wherein the second voids have a vertical thickness, and further comprising the following steps in the following order:
   forming strips within the second voids to narrow said vertical thickness and to reduce an amount of the high-k dielectric material which is exposed;

removing the reduced amount of the exposed high-k dielectric material; and at least partially filling the second voids with insulative material.

10. The method of claim 8 wherein the second voids have a vertical thickness, and further comprising:

forming sacrificial material within the second voids to narrow said vertical thickness and to reduce an amount of the high-k dielectric material which is exposed;

removing the reduced amount of the exposed high-k dielectric material;

removing the sacrificial material; and after removing the sacrificial material, at least partially filling the second voids with insulative material.

11. The method of claim 10 wherein the sacrificial material comprises silicon nitride.

12. The method of claim 1 further comprising:

recessing the first levels relative to the second levels to form cavities along the first levels, and to form a first undulating sidewall surface of the opening;

forming a layer of silicon along the first undulating surface;

partially oxidizing the layer of silicon to form an oxide laterally outward of remaining silicon; the remaining silicon being within the cavities; and removing the oxide to form the peripheral sidewall of the opening to have a second undulating surface extending along the remaining silicon and along the second material of the second levels; wherein the forming of the charge-blocking material comprises forming the charge-blocking material along the second undulating surface.

13. The method of claim 12 wherein the charge-blocking material has an undulating topography along the second undulating surface; wherein the charge-storage material is formed along the undulating topography of the charge-blocking material; and wherein each of the vertically-spaced segments of the charge-storage material has a rounded configuration.

14. The method of claim 12 further comprising forming the high-k dielectric material within the first voids to line the first voids; wherein the forming of the conductive levels comprises forming conductive material within the lined first voids; wherein the forming the second voids exposes portions of the high-k dielectric material above and below the conductive material; and further comprising removing the exposed portions of the high-k dielectric material.

15. The method of claim 14 further comprising at least partially filling the second voids with insulative material.

16. A method of forming an integrated structure, comprising:

forming a vertical stack of alternating first and second levels; the first levels comprising first material and the second levels comprising second material;

forming an opening to extend through the stack, the opening having a peripheral sidewall;

forming charge-blocking material adjacent the peripheral sidewall;

forming charge-storage material adjacent the charge-blocking material;

forming gate-dielectric material adjacent the charge-storage material;

forming channel material adjacent the gate-dielectric material;

removing the second material to leave first voids;

forming conductive material within the first voids;

forming high-k dielectric material within the first voids to line the first voids;

removing portions of the high-k dielectric material above and below the conductive material;

removing the first material to leave second voids;

forming strips within the second voids to narrow a vertical thickness of the second voids; and extending the second voids through the charge-storage material to divide the charge-storage material into vertically-spaced segments.

17. The method of claim 16 wherein the forming of the second voids exposes portions of the high-k dielectric material above and below the conductive material.

18. The method of claim 16 further comprising recessing the first levels relative to the second levels to form cavities along the first levels.

19. The method of claim 18 further comprising filling the cavities with sacrificial material to form the peripheral sidewall of the opening to have a substantially straight sidewall surface.

20. The method of claim 19 further comprising removing the sacrificial material during the forming of the second voids.

21. A method of forming an integrated structure, comprising:

forming a vertical stack of alternating first and second levels; the first levels comprising first material and the second levels comprising second material;

forming an opening to extend through the stack, the opening having a peripheral sidewall;

recessing the first levels relative to the second levels to form cavities along the first levels, and to form a first undulating sidewall surface of the opening;

forming a layer of silicon along the first undulating sidewall surface;

partially oxidizing the layer of silicon to form an oxide laterally outward of remaining silicon, the remaining silicon being within the cavities;

forming charge-blocking material adjacent the peripheral sidewall;

forming charge-storage material adjacent the charge-blocking material;

forming gate-dielectric material adjacent the charge-storage material;

forming channel material adjacent the gate-dielectric material;

removing the second material to leave first voids;

forming conductive levels within the first voids;

removing the first material to leave second voids; and extending the second voids through the charge-storage material to divide the charge-storage material into vertically-spaced segments.

22. The method of claim 21 further comprising removing the oxide to form the peripheral sidewall of the opening to have a second undulating surface extending along the remaining silicon and along the second material of the second levels.

23. The method of claim 21 wherein the forming of the charge-blocking material comprises forming the charge-blocking material along the second undulating surface.

* * * * *